United States Patent [19]

Paoli et al.

[11] Patent Number: 5,455,429

[45] Date of Patent: Oct. 3, 1995

[54] SEMICONDUCTOR DEVICES INCORPORATING P-TYPE AND N-TYPE IMPURITY INDUCED LAYER DISORDERED MATERIAL

[75] Inventors: Thomas L. Paoli, Los Altos; John E. Northrup, Palo Alto, both of Calif.

[73] Assignee: Xerox Corporation, Stamford, Conn.

[21] Appl. No.: 174,912

[22] Filed: Dec. 29, 1993

[51] Int. Cl.[6] .................... H01L 33/00; H01L 29/161; H01L 29/167

[52] U.S. Cl. ............ 257/20; 257/85; 257/99; 257/192; 257/465; 257/609; 372/46

[58] Field of Search ............... 257/81, 83, 85, 257/89, 99, 197, 465, 609, 20, 21, 22, 24, 192; 372/45, 46, 50

[56] References Cited

U.S. PATENT DOCUMENTS

| | | | |
|---|---|---|---|
| 4,824,798 | 4/1989 | Burnham et al. | 437/81 |
| 4,837,607 | 6/1989 | Kemmer et al. | 257/465 |
| 4,987,468 | 1/1991 | Thornton | 257/198 |
| 5,013,684 | 5/1991 | Epler et al. | 437/129 |
| 5,038,185 | 8/1991 | Thornton | 372/47 |
| 5,062,115 | 10/1991 | Thornton | 372/50 |
| 5,164,797 | 11/1992 | Thornton | 257/197 |
| 5,231,298 | 7/1993 | Daly | 257/609 |
| 5,317,586 | 5/1994 | Thornton et al. | 372/46 |

OTHER PUBLICATIONS

"The Diffusion of Silicon in Gallium Arsenide", G. R. Antell, 1965, Solid–State Electronics, vol. 8 pp. 943–946.

"Diffusion of sillicon in gallium arsenide using rapid thermal processing: Experimental and model", Greiner et al., Applied Physics Letters, vol. 44(8) pp. 750–752 (Apr. 15, 1984).

"Disorder of an $Al_xGa_{1-x}As$–GaAs Superlattice by Donor Diffusion", K. Meehan, et al., Applied Physics Letters, vol. 45(5), pp. 549–551, (Sep. 1, 1984).

"Design of Fabry–Perot Surface–Emitting Lasers with a Periodic Gain Structure", S. W. Corzine et al., IEEE Journal of Quantum Electronics, vol. 25, No. 6, pp. 1513–1524, Jun. 1989.

"Fabrication of Low Threshold Voltage Microlasers", Scherer et al., Electronics Letters, vol. 28, No. 13, pp. 1224–1226, Jun. 18, 1992.

"Channelling photodiode: A new versatile interdigitated p–n junction photodetector", F. Capasso et al., Applied Phys. Lett. 41(1)), pp. 944–946, Nov. 15, 1982.

"Doping (n–i–p–i) Superlattices", G. Döhler et al., Academic Press, Inc., Synthetic Modulated Structures, pp. 163–214, 1985.

Primary Examiner—Mahshid D. Saadat
Attorney, Agent, or Firm—Oliff & Berridge

[57] ABSTRACT

Novel semiconductor devices are monolithically defined with p-type and n-type wide bandgap material formed by impurity induced layer disordering of selected regions of multiple semiconductor layers. The devices are beneficially fabricated by simultaneously forming the n-type and p-type layer disordered regions with sufficiently abrupt transitions from disordered to as-grown material. The novel devices include a heterojunction bipolar transistor monolithically integrated with an edge emitting heterostructure laser or a surface emitting laser, a heterostructure surface emitting laser, a heterostructure surface emitting laser having active distributed feedback, devices containing multiple buried layers which are individually contacted such as p-n junction surface emitting lasers, carrier channeling devices, and "n-i-p-i" or hetero "n-i-p-i" devices, and novel interdigitated structures, such as optical detectors and distributed feedback lasers.

25 Claims, 14 Drawing Sheets

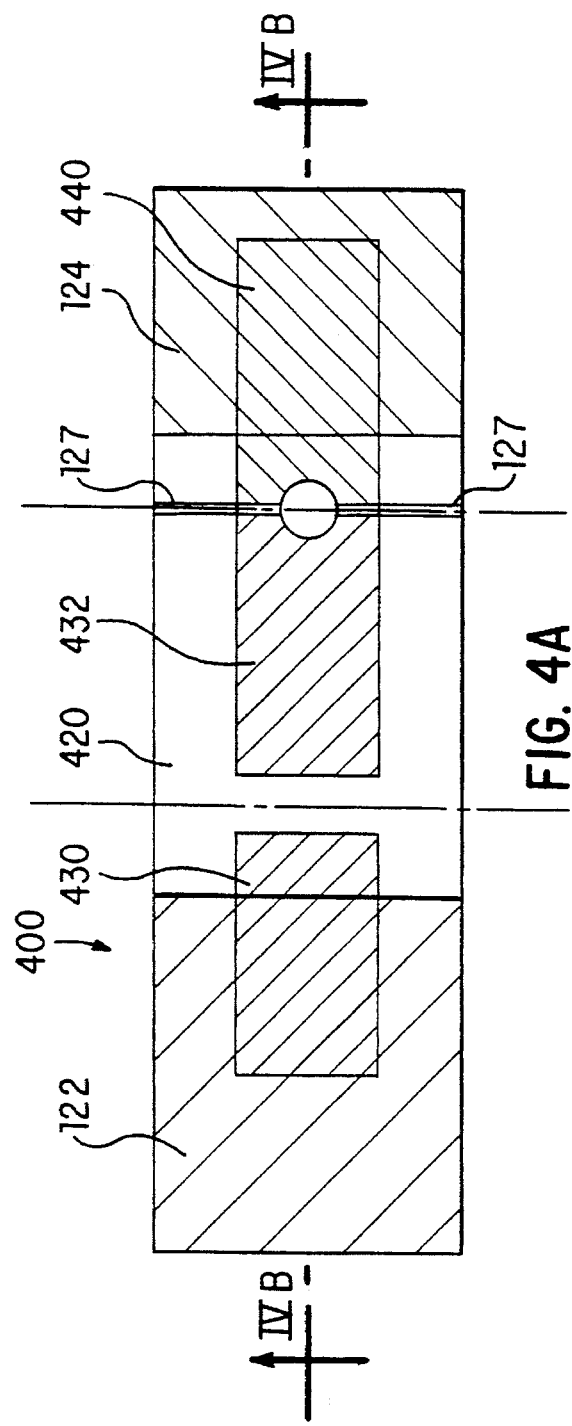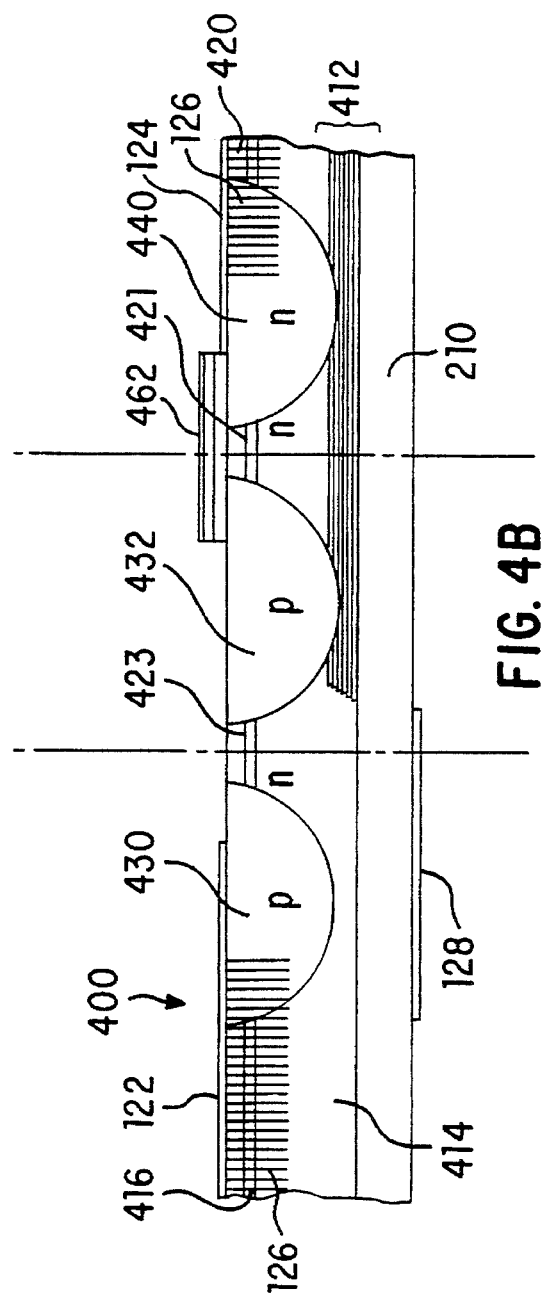

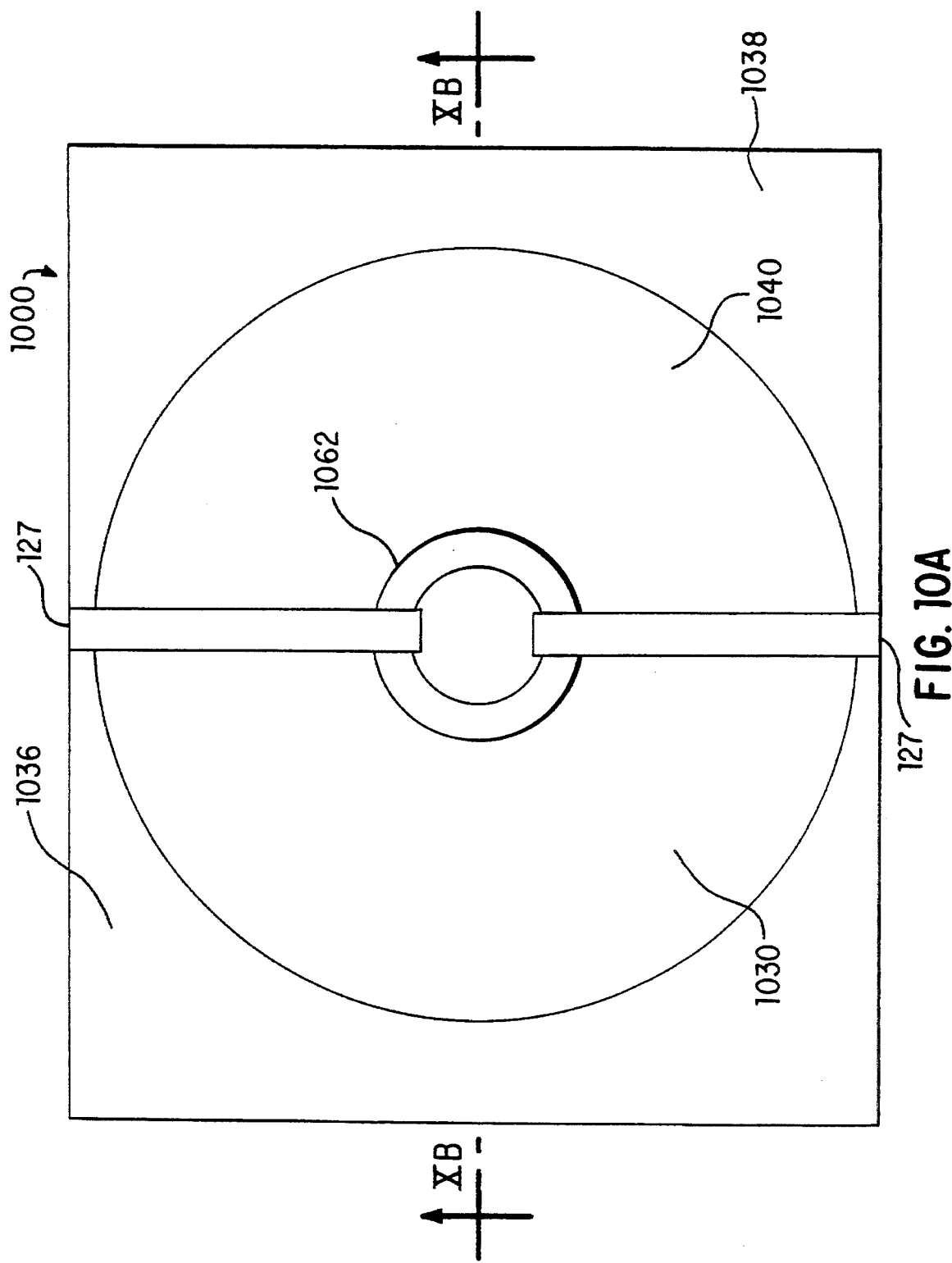

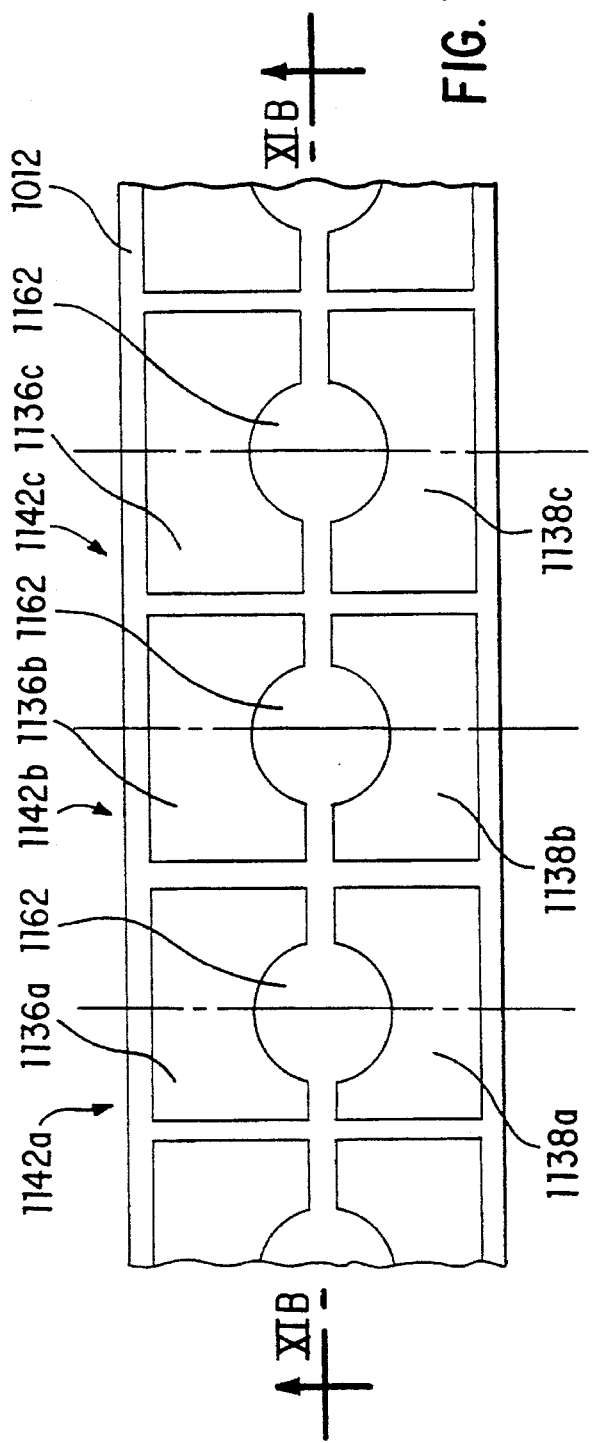
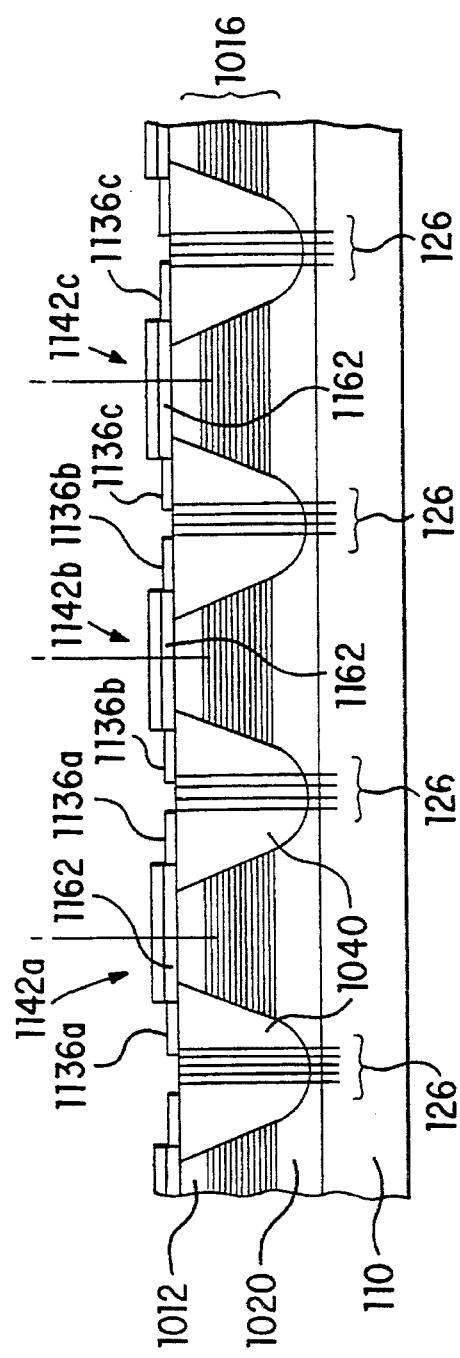

SEMICONDUCTOR DEVICES INCORPORATING P-TYPE AND N-TYPE IMPURITY INDUCED LAYER DISORDERED MATERIAL

BACKGROUND OF THE INVENTION

1. Field of the Invention

This invention relates to novel semiconductor devices and structures which incorporate p-type and n-type wide bandgap material formed by impurity induced layer disordering of multiple semiconductor layers. U.S. patent application Ser. No. 07/174,911, now U.S. Pat. No. 5,376,583, filed together with this application, describes a method for making p-type doped materials alone or simultaneously with n-type disordered materials and is incorporated herein by reference.

In particular, this invention relates to five overlapping classes of novel devices: integrated transistor and edge emitting laser diodes; integrated transistors and surface emitting diodes; a laterally injected surface emitting laser diode; a carrier channeling or "nipi" device; and an interdigitated semiconductor device. Further, the laterally injected surface emitting laser diodes includes devices having active distributed optical feedback to achieve lasing oscillation. These active distributed devices may incorporate only one or both of the n-type and p-type IILD materials.

2. Related Art

Impurity-induced layer disordering of multiple layers of Group III-V compound semiconductors is an important step in fabricating optoelectronic devices such as lasers, transistors, and photodiodes. The diffusion of silicon or the like into multiple layers of Group III-V semiconductors under Group V-rich conditions is well known to form layer disordered material. Unfortunately, such impurity induced layer disordering with silicon was limited to forming n-type material. In addition, while it is known that the diffusion of zinc into multiple layers of Group III-V semiconductors forms p-type doped layer disordered material, such p-type semiconductor materials were not suitable for use in many devices because zinc diffused materials lack an abrupt and reproducible transition from the ordered to disordered material.

Accordingly, most known devices requiring both p-type and n-type doped materials formed by impurity induced layer disordering could not be usefully manufactured.

In particular, surface emitting diode lasers are an important light source for many applications, such as optical disk systems, laser printing and scanning, optical interconnections, and fiber optic communications. One problem with such lasers is that they inherently have much less available optical gain than edge-emitting lasers, due to the small active volume of the surface emitter. Consequently, achieving a useful level of performance requires efficient use of the available optical gain and minimizing both the optical loss and heat generated in the surface emitting structure.

A partial solution to the gain problem is disclosed by S. W. Corzine, et al., in "Design of Fabry-Perot Surface-Emitting Lasers with a Periodic Gain Structure", IEEE Journal of Quantum Electronics Vol. 25(6), pp. 1513–1524, June 1989. Corzine teaches periodically spacing the active layers between the mirrors of the surface emitting laser cavity. The optimum spacing is chosen such that the active layer coincides with the maximum in the standing wave pattern of the optical field set up by the cavity mirrors. This spacing is approximately one-half of the lasing wavelength in the semiconductor.

Although such periodic gain enables more efficient use of the optical gain than a uniformly excited active layer, this approach has several limitations. For example, the threshold current increases as the bandgap of the passive layer between pairs of active layers is increased, thereby preventing the maximum confinement of charged carriers in the active layer, which is needed for operation at high temperatures. Furthermore, Corzine teaches placement of the periodic gain region within a laser cavity formed by two distributed Bragg reflectors, both of which require at least 18 to 25 layers to achieve the required level of reflectivity. Maximizing the electrical conductivity of these layers is not consistent with minimizing their optical absorption. Finally, Corzine fails to provide any means for electrically exiting the active layers.

Another problem for surface emitting lasers is that achieving a useful level of performance requires minimizing optical loss in the surface emitting structure. Consequently, using undoped active and passive layers throughout the construction of such lasers is desirable, in order to avoid optical absorption from free carriers. However, undoped layers have poor electrical conductivity, which is not consistent with the low electrical resistance required to minimize the heat generated in injection type diode lasers. This is especially a problem when the electrical current must pass through 20, 30 or more layers in the gain region and another 20 to 30 layers in each of the cavity mirrors. Excessive heating in the surface emitter not only increases the threshold current, but most seriously shifts the lasing wavelength away from the optimum wavelength of the cavity mirrors.

A partial solution to the optical loss/conductivity problem is disclosed by A. Scherer, et al., in "Fabrication of Low Threshold Voltage Microlasers", Electronics Letters Vol. 28 (13), pp. 1224–1226, June 1992. In Scherer's approach, current is injected through a thin heavily doped contact layer grown under the output mirror of the cavity, thereby avoiding the current having to pass through one undoped mirror. However, the current must still pass through the other cavity mirror, which is highly doped for electrical conductivity and therefore introduces significant optical loss. The current must also pass through the active layers, which are undoped and are therefore electrically resistive. Therefore, it is impractical to combine the contacting approach of Scherer with the periodic gain teachings of Corzine. In addition, implementing Scherer's contact requires etching through the output mirror to expose the underlying contact layer, thereby introducing undesirable manufacturing cost and complexity, as well as potentially lowering the yield due to damage to the mirror.

Accordingly, there is need for designs and fabrication techniques which enable low current, low voltage and high temperature operation of surface emitting diode lasers. Beneficially, those designs and fabrication techniques should be applicable to constructing arrays of closely spaced, independently addressable surface emitting lasers.

3. Related Application

In the Ser. No. 08/174911 application, novel methods are disclosed for producing p-type wide bandgap material by impurity induced layer disordering (IILD) of multiple semiconductor layers and for simultaneously producing n-type and p-type IILD materials in the same set of multiple semiconductor layers.

SUMMARY OF THE INVENTION

This invention provides for novel optoelectronic devices comprising a heterojunction bipolar transistor monolithically integrated with a heterostructure laser, wherein all operational contacts are beneficially on one surface of the device.

This invention also provides for novel optoelectronic devices comprising a heterostructure laser monolithically integrated with a heterojunction bipolar transistor having a base contact on the substrate side of the chip.

This invention further provides for novel semiconductor devices containing multiple buried layers which individually contact either a wide bandgap collector or emitter. The devices may require p-type, n-type, or p-type and n-type contacting. Structures of this type are p-n junction surface emitting lasers, carrier channeling devices, and "n-i-p-i" or hetero "n-i-p-i" devices.

This invention additionally provides for novel interdigitated structures. Structures of this type can be used, for example, to make fast optical detectors or distributed feedback lasers.

This invention also provides for a novel laterally injected surface emitting laser having the laser anode and cathode on the emitting surface of the chip.

This invention additionally provides for a novel laterally injected active distributed feedback surface emitting laser having the laser cathode on the emitting surface of the chip and the laser anode on an opposite side of the chip.

This invention further provides for a novel laterally injected active distributed feedback surface emitting laser having the laser anode on the emitting surface of the chip and the laser cathode on an opposite side of the chip.

It is a principal object of this invention to fabricate novel semiconductor devices with selected regions of n-type and p-type wide bandgap material formed by impurity induced layer disordering within a multiple layer semiconductor structure.

It is a further object of this invention to fabricate such novel semiconductor devices by simultaneously forming said n-type and p-type layer disordered regions.

It is another principal object of this invention to minimize the number of layers required in a surface emitting laser structure by obtaining the optical feedback required to sustain lasing oscillation from the structure of the active layers providing the optical gain.

It is a further object of this invention to minimize the operating voltage in an electrically activated surface emitting laser structure by injecting charge carriers directly into the active layers, thereby eliminating current passing through passive layers of the structure.

It is yet another object of this invention to provide a high density array of such surface emitting lasers on a single substrate.

According to this invention, the novel devices are formed within a multilayer semiconductor structure by impurity induced layer disordering which selectively produces n-type and/or p-type wide bandgap material, wherein the transition from ordered layers to p-doped disordered layers has a sufficiently abrupt and reproducible transition.

According to this invention, the novel surface emitting lasers and arrays are formed within an optically active distributed feedback multilayer structure by impurity induced layer disordering to form n-type and/or p-type material.

Other devices and advantages, together with the full understanding of the invention, will become apparent and appreciated by referring to the following description and claims taken in conjunction with the accompanying drawings.

BRIEF DESCRIPTION OF THE DRAWINGS

The invention is described in relation to the following drawings, in which like reference symbols refer to like elements, and wherein:

FIG. 4A is a top plan view of a monolithic surface emitting laser and P-N-P transistor formed with its base contact on the substrate side of the chip;

FIG. 4B is a cross-sectional view of the integrated transistor/laser

FIG. 10A is a top plan view of a laterally injected surface emitting laser having the anode and cathode on the emitting surface;

FIG. 11 is a top plan view of an array of individually addressable surface emitting diode lasers made according to the principles of this invention; and FIG. 11B is a cross-sectional view of the surface emitting laser array of FIG. 11A.

DETAILED DESCRIPTION OF THE PREFERRED EMBODIMENTS

Silicon as a dopant impurity in arsenic-rich GaAs or AlGaAs prefers to occupy a gallium site and therefore acts as a donor. Silicon is believed to diffuse by forming a mobile complex with a gallium vacancy. Accordingly impurity-induced layer disordering (IILD) of multiple layers of GaAs and AlGaAs by diffusion of silicon under arsenic-rich conditions is known to produce only n-type wide bandgap material. On the other hand, silicon as a dopant impurity in gallium-rich conditions prefers to occupy the arsenic site and consequently acts as an acceptor. Because silicon diffuses under gallium-rich conditions by forming a complex with a gallium interstitial, it is possible to use silicon, in conjunction with gallium-rich annealing conditions or in a gallium-rich source layer, to obtain p-type impurity-induced layer disordering of multiple layers of GaAs and AlGaAs.

The ability to make p-type and n-type IILD regions with silicon is especially beneficial due to the abrupt transition between the disordered and non-disordered regions produced by the silicon diffusion front. According to the present invention, the abruptness of this transition enables the formation of novel semiconductor structures from selected regions of n-type and p-type wide bandgap material produced by impurity induced layer disordering within a multiple layer semiconductor structure. Furthermore, according to the present invention, such device structures are beneficially made by simultaneously forming the n-type and p-type IILD regions. Simultaneous formation of the n-type and p-type IILD regions is a significant advantage since it eliminates a second annealing which causes changes in the depth and shape of the disordered region produced by a first annealing. Simultaneous formation of the n-type and p-type IILD regions is achieved by controlling the dopant impurity in the silicon layer and/or by controlling the ambient environment during annealing, as described in copending U.S. patent application Ser. No. 07/174,911 filed together with the present application.

Simultaneous formation of n-type and p-type IILD regions allows several types of novel devices to be made. One such class of devices is monolithically integrated combinations of separate optoelectronic devices.

Figure 1:
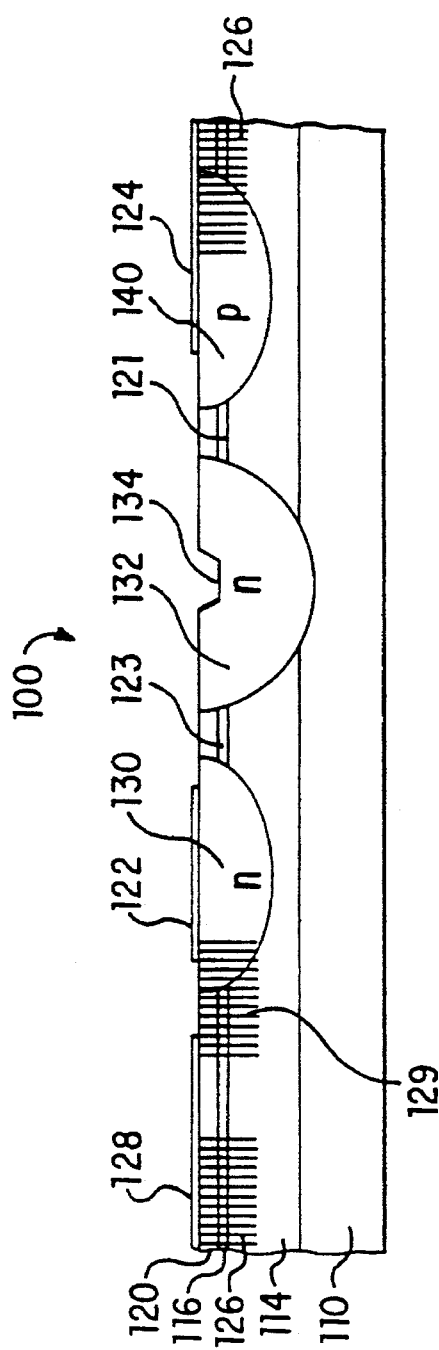
FIG. 1 is a cross-sectional view of a monolithic N-P-N transistor and edge emitting laser formed with operational contacts on one surface.

For example, FIG. 1 shows an integrated device 100 comprising an N-P-N heterojunction bipolar transistor monolithically integrated with a laterally injected edge emitting diode laser. The integrated transistor/laser 100 comprises a semi-insulating substrate 110 of GaAs. A cladding layer 114 of p-$Ga_{1-x}Al_xAs$ is epitaxially deposited on the substrate 110. An active p-type multilayer 116, which serves as the active waveguide 121 in the laser section and as the base channel 123 in the transistor section, is formed over the cladding layer 114. A cladding layer 120 of p-$Ga_{1-x}Al_xAs$ is formed over the multilayer 116. The p-type multilayer 116 comprises a relatively thin conventional double heterostructure active layer of p-GaAs or p-$Ga_{1-y}Al_yAs$, or a single quantum well of p-GaAs or p-$Ga_{1-y}Al_yAs$, or a single quantum well of either p-(GaAs or p-$Ga_{1-y}Al_yAs$ sandwiched between carrier confinement layers of p-$Ga_{1-z}Al_zAs$ where x>z>y, or a multiple quantum well structure of alternating well layers of p-GaAs or p-$Ga_{1-y}Al_yAs$ and corresponding barrier layers of either AlAs or p-$Ga_{1-y'}Al_{y'}As$ sandwiched between carrier confinement layers of $Ga_{1-z}Al_zAs$, where x>z≧y'>y. All of these layers may be deposited with the well known techniques of metal organic vapor deposition or molecular beam epitaxy.

Within the epitaxially deposited layers, an N-P-N transistor as taught in U.S. Pat. No. 4,987,468 to Thornton and incorporated herein by reference, and separated edge emitting laser are formed to make the monolithic laser/transistor 100. The transistor of this structure comprises an n-type disordered region 130 serving as the transistor emitter, n-type disordered region 132 as the transistor collector, and base channel 123 formed in the p-type multilayer 116 between disordered regions 130 and 132. The laser of this structure is formed between p-type disordered region 140 and n-type disordered region 132. Thus, region 132 is simultaneously the cathode of the laser and the collector of the transistor.

When forming the first laser region and the first and second transistor regions, one or more of these regions should have an energy bandgap which is larger than at least the smallest energy bandgap of the materials forming the active multilayer stratum. That is, the bandgap of the lowest bandgap material of the active multilayer stratum must be smaller than the bandgap of one or more of the first laser region and the first and second transistor regions. This is true in all of the following embodiments of the semiconductor laser, whether alone or when integrated with the semiconductor transistor, whether the laser is a surface emitting or an edge-emitting laser, and whether the region is one of the laser region and the first and second transistor regions, for the integrated transistor/laser embodiments, or the laser anode and cathode regions, for the semiconductor laser embodiments.

The electrical connections are made to the integrated structure 100 through a first metal contact layer 124, which is connected to the laser anode, a second metal contact layer 122, which is connected to the transistor emitter, and a third metal contact layer 128, which remotely accesses the base channel 123. Electrical isolation between the base contact 128 and the transistor emitter 130 is provided by the proton bombarded region 129. The proton bombarded region 126 isolates the device 100 from the remainder of the chip. An important feature of the disordered region 132 is that it extends substantially through all the epitaxially deposited layers and into the semi-insulating substrate 110 in order to electrically isolate the transistor from the laser.

After the layers 114–120 are formed, a shallow groove 134 is etched in the second cladding layer 120 where the disordered region 132 will be formed. An arsenic-rich silicon layer is then deposited over the second cladding layer 120 in the area where the n-type diffused/disordered regions 130 and 132 will be formed. Similarly, a gallium-rich silicon layer is deposited over the second cladding layer 120 in the area where the p-type diffused/disorder region 140 will be formed. Then, the arsenic-rich silicon layer and the gallium-rich silicon layer are capped with a silicon nitride cap layer. After the cap layer has been applied, the capped heterostructure is annealed at a high temperature.

By annealing the capped heterostructure device 100, silicon atoms in the arsenic-rich silicon layer and gallium-rich silicon layer diffuse into heterostructure multilayers 114–120 to form the silicon impurity induced disordered regions 130, 132 and 140. Because of the gallium-rich layer, the silicon diffuses into the heterostructure multilayers 114–120 in what is effectively a gallium-rich environment and the layer intermixing consequently produced by this diffusion forms the p-type layer disordered region 140. Because of the arsenic-rich layer, the silicon diffuses in what is effectively an arsenic-rich environment and the layer intermixing consequently produced by this diffusion forms the n-type layer disordered regions 130 and 132. The silicon diffusion is stopped after the disordered region 132 reaches the substrate 110 but before the disordered regions 130 and 140 reach the substrate 110. Because of the groove 134, the disordered region 132 extends deeper into the multilayer structure than regions 130 and 140. Thus, the disordered region 132 isolates the base contact 128 from the active waveguide 121. Alternately, this isolation can be achieved without the groove 134 by diffusing the silicon above region 132 for longer than the silicon above regions 130 and 140. This is accomplished by first depositing silicon only above region 132 and then annealing for a short period in order to drive the silicon part way into the multilayers in this region. After this prediffusion, the silicon is deposited above regions 130 and 140 and the annealing is continued to completion.

In an alternate method for forming integrated device 100, the arsenic-rich silicon layer, placed where disordered regions 130 and 132 will be formed, is replaced with a undoped silicon layer. Accordingly, the final silicon nitride cap layer is formed only over the gallium-rich silicon layer, leaving the undoped silicon layer exposed. Then, the entire heterostructure is annealed at a high temperature in an arsenic-rich environment. Alternately, if the gallium-rich silicon layer, rather than the arsenic-rich silicon layer, is replaced with undoped silicon, the heterostructure layers are annealed in a gallium-rich environment.

By annealing the heterostructure layers in a gallium- or arsenic-rich environment with the undoped silicon layer exposed, the exposed silicon diffuses into the heterostructure layers to form either the n-type regions 130 and 132 or the p-type region 140, while diffusion of the capped silicon will form the other of the n-type regions 130 and 132 or the p-type region 140.

Alternately, an integrated transistor/laser can be formed by combining an P-N-P transistor and a laterally injected edge emitting laser. The geometry of the integrated structure is the same as illustrated in FIG. 1 with all the epitaxially layers doped n-type instead of p-type, the disordered regions 130 and 132 made with p-type diffusions and the disordered region 140 made with an n-type diffusion, according to the methods of this invention. The IILD region 130 remains the emitter of the transistor and the IILD region 132 remains the collector. However, the IILD region 140 becomes the cathode for the laser. The contact layer 128 continues to provide remote access to the base channel 123.

Figure 2:
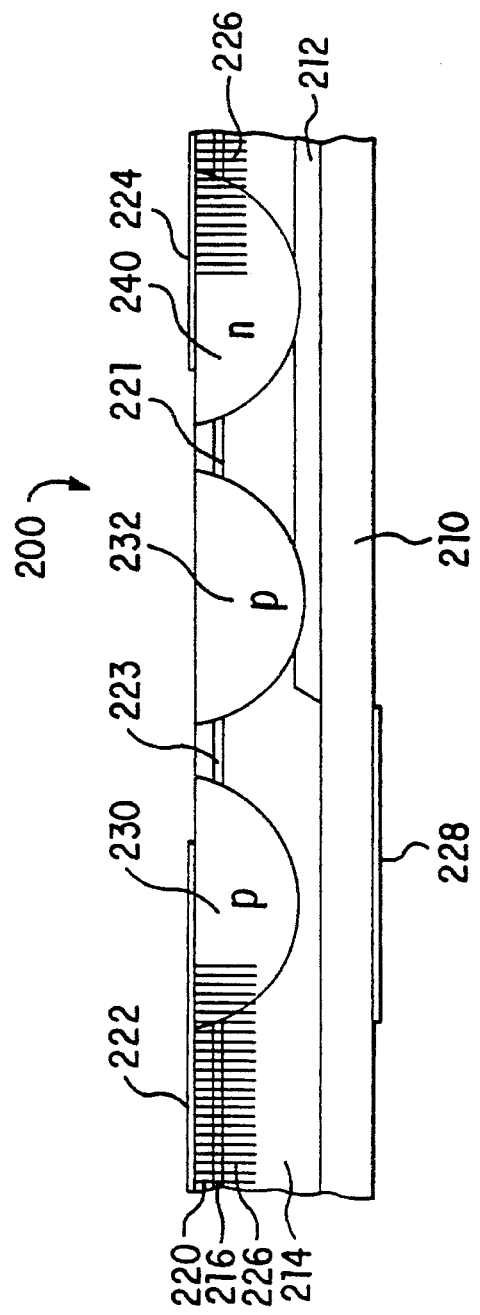
FIG. 2 is a cross-sectional view of a monolithic edge emitting laser and P-N-P transistor formed with its base contact on the substrate side of the chip.

A second embodiment of a heterojunction bipolar transistor integrated with a laterally injected edge emitting diode laser is shown in FIG. 2. The integrated transistor/laser 200 comprises a substrate 210 of n-type GaAs, upon which is grown a blocking layer 212 of undoped GaAs or AlGaAs. Before growing additional layers, portions of the blocking layer 212 are removed in order to expose the underlying substrate 210. A cladding layer 214 of n-Ga$_{1-x}$Al$_x$As is then epitaxially grown on the exposed portion of the substrate 210 and the remaining portion of the blocking layer 212. An active n-type multilayer 216, serving as the active waveguide 221 in the laser section and as the base channel 223 in the transistor section, is formed over the cladding layer 214. A second cladding layer 220 of n-Ga$_{1-x}$Al$_x$As is formed over the multilayer 216. The n-type multilayer 216 comprises a relatively thin conventional double heterostructure active layer of p-GaAs or p-Ga$_{1-y}$Al$_y$As, or a single quantum well of p-GaAs or p-Ga$_{1-y}$Al$_y$As, or a single quantum well of either p-GaAs or p-Ga$_{1-y}$Al$_y$As sandwiched between carrier confinement layers of p-Ga$_{1-z}$Al$_z$As where x>z>y, or a multiple quantum well structure of alternating well layers of p-GaAs or p-Ga$_{1-y}$Al$_y$As and corresponding barrier layers of either AlAs or p-Ga$_{1-y'}$Al$_{y'}$As sandwiched between carrier confinement layers of Ga$_{1-z}$Al$_z$As, where x>z≧y'>y. All of these layers may be deposited with the well known techniques of metal organic vapor deposition or molecular beam epitaxy.

Within the epitaxially deposited layers, a P-N-P transistor and a separated edge emitting laser are formed and combined to make the monolithic laser/transistor 200. The transistor of this structure comprises a p-type disordered region 230 serving as the transistor emitter, a p-type disordered region 232 serving as the transistor collector, and a base channel 223 formed in the n-type multilayer 216 between disordered regions 230 and 232. The laser of this structure is formed between the n-type disordered region 240 and the p-type disordered region 232. Thus, the IILD region 232 is simultaneously the anode of the laser and the collector of the transistor. An important feature of the disordered region 232 is that it extends substantially through all the epitaxially deposited layers and into the blocking layer 212. This feature allows the n-type substrate 210 to be used to access the transistor base channel 223.

The electrical connections are made to the integrated structure 00 through the first metal contact layer 224, which is connected to the laser cathode, the second metal contact layer 222, which is connected to the transistor emitter, and the third metal contact layer 228, which is connected to the base channel 223 through the substrate 210. The proton bombarded regions 226 isolate the integrated transistor/laser 200 from the rest of the chip.

The integrated transistor/laser 200 is made by simultaneously forming the n-type and p-type disordered regions by annealing the multiple layers 212–220 and the substrate with an arsenic-rich silicon layer deposited over the second cladding layer 220 in the area where the n-type disordered region 240 will be formed and a gallium-rich silicon layer deposited over the second cladding layer 220 in the area where p-type disordered regions 230 and 232 will be formed, as described above.

An important feature of the disordered region 232 is that it extends substantially through all the epitaxially deposited layers and into the undoped blocking layer 212 in order to electrically isolate the transistor from the laser. Thus the annealing process is stopped when regions 232 and 240 penetrate the blocking layer 212 but before the IILD region 230 reaches the substrate 210. Alternately, the deeper diffusion in region 232 can be aided by etching a groove in the second cladding layer 220 where region 232 will be formed before depositing the silicon layer (as shown in FIG. 1), or by diffusing the silicon above region 232 for longer than the silicon above regions 230 and 240. The latter approach is accomplished by first depositing silicon only above region 232 and then annealing for a short time in order to drive the silicon part way into the multilayers in this region. After this prediffusion, silicon is deposited above regions 230 and 240 and the annealing is continued to completion.

Alternately, the integrated transistor/laser 200 is made by replacing the arsenic-rich silicon, where disordered region 240 will be formed, with an undoped silicon layer and annealing the multiple layers and substrate at a high temperature in an arsenic-rich environment as described above. Alternately, if the gallium-rich silicon layer, rather than the arsenic-rich silicon layer, is replaced with undoped silicon, the multiple layers and substrate are annealed at a high temperature in a gallium-rich environment as described above.

Alternately, an integrated transistor/laser can be formed by combining an N-P-N transistor and a laterally injected laser. The geometry of the integrated structure is the same as illustrated in FIG. 2, except that the substrate and all the epitaxially layers are doped p-type instead of n-type, the disordered regions 230 and 232 are made with n-type diffusions and the disordered region 240 is made with a p-type diffusion, according to the methods of this invention. The IILD region 230 remains the emitter of the transistor and region 232 remains the collector. However region 240 becomes the anode for the laser. Contact 228 continues to provide access to the base channel 223 through the p-type substrate 210.

Figure 3A:
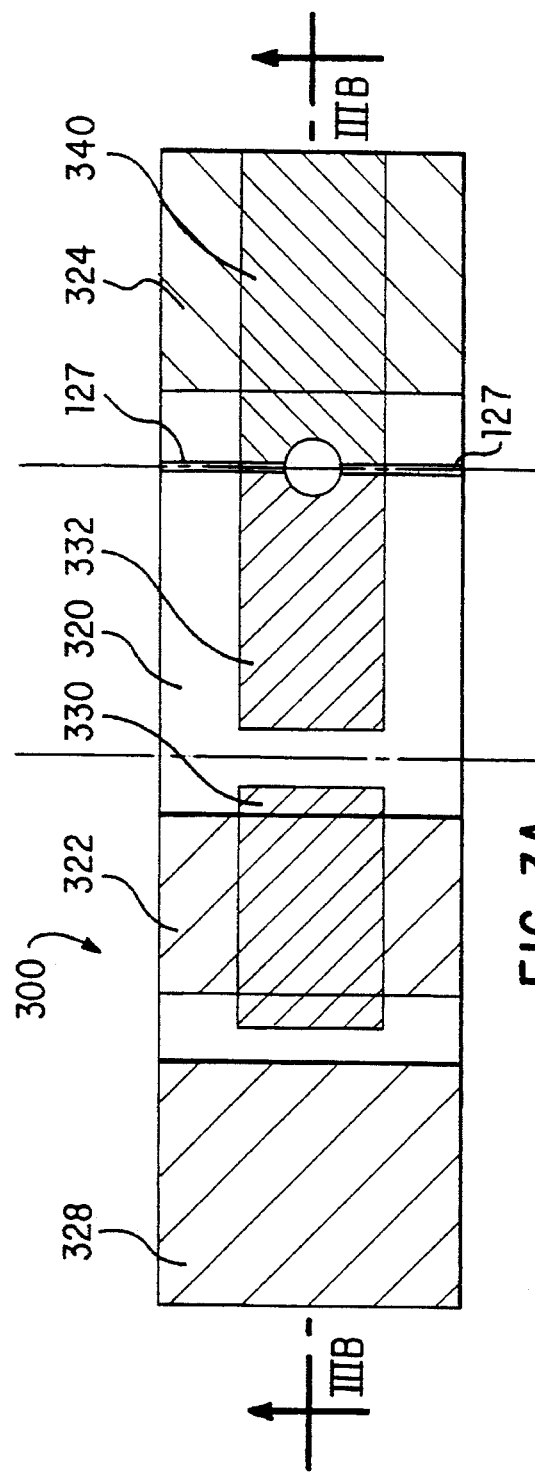
FIG. 3A is a top plan view of a monolithic N-P-N transistor and surface emitting laser formed with operational contacts on one surface.
Figure 3B:
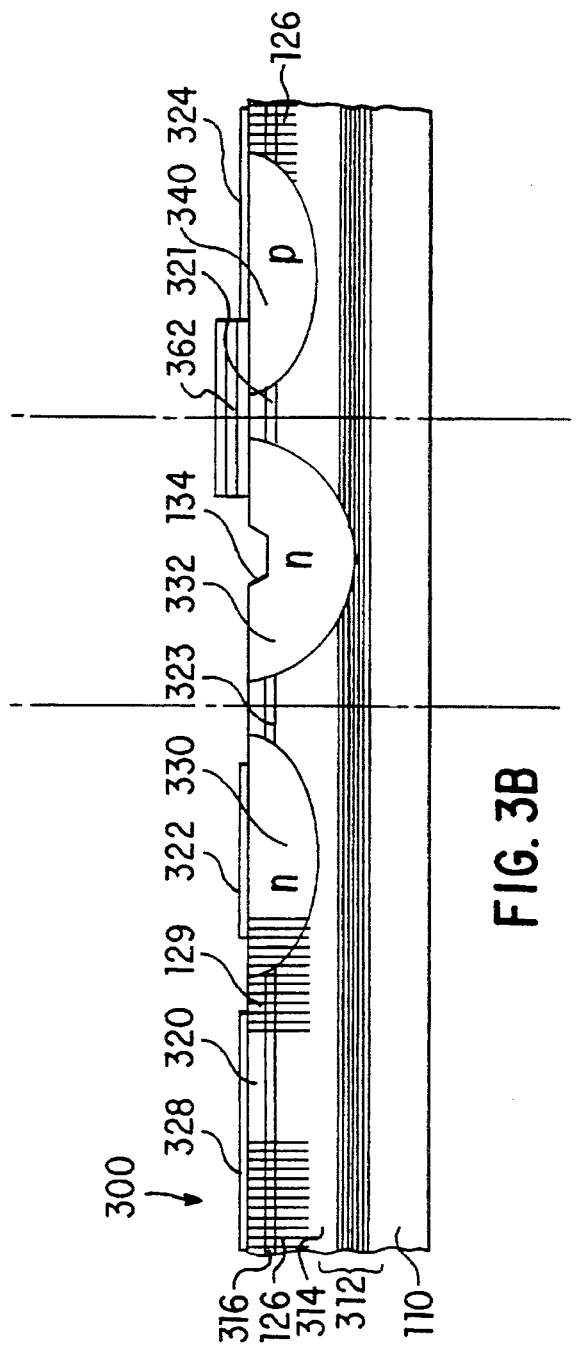
FIG. 3B is a cross-sectional view of the integrated transistor/laser of FIG. 3A.

FIGS. 3A and 3B show an N-P-N heterojunction bipolar transistor monolithically integrated with a laterally injected surface emitting laser, made according to the principles of this invention. This integrated device is similar in some respects to the integrated device of FIG. 1, with a surface emitting laser used in place of the edge emitting laser of FIG. 1. The integrated device 300 comprises the semi-insulating substrate 110 of GaAs, upon which is epitaxially deposited a multilayer reflector 312, a spacer layer 314 of p-doped $Ga_{1-y}Al_yAs$, a p-doped active multilayer 316, and a second spacer layer 320 of undoped $Ga_{1-y}Al_yAs$. The active multilayer 316 can comprise a thin undoped layer of either GaAs or $Ga_{1-w}Al_wAs$, or an undoped quantum well layer of either GaAs or $Ga_{1-z}Al_wAs$, or a multiple quantum well structure of undoped quantum well layers of either GaAs or $Ga_{1-w}Al_wAs$ alternating with corresponding undoped barrier layers of either AlAs of $Ga_{1-y}Al_yAs$ where $v \geq y > w$. The multilayer reflector 312 comprises an alternating stack of undoped $Ga_{1-z}Al_zAs$ and $Ga_{1-z'}Al_{z'}As$, where $z \neq z'$, which is designed to provide high optical reflectivity at the lasing wavelength, as known to those skilled in the art.

Within the epitaxially deposited layers, an N-P-N transistor and separated laser are formed to make the monolithic laser/transistor 300. The transistor of this structure comprises an n-type disordered region 330 serving as the transistor emitter, an n-type disordered region 332 serving as the transistor collector, and a base channel 323 which is formed in the p-type multilayer 316 between the disordered regions 330 and 332. The surface emitting laser of this structure is formed between the p-type disordered region 340 and the n-type disordered region 332. Thus, the IILD region 332 is simultaneously the cathode of the laser and the collector of the transistor, while the IILD region 340 is the anode of the laser.

An important feature of the disordered region 332 is that it extends substantially through all the epitaxially deposited layers and into the multilayer reflector 312 to form the cylindrical optical waveguide for the surface emitting laser. This feature also isolates the transistor base 328 from the laser.

Proton bombardment in regions 127 provides electrical isolation between the cathode/collector 332 and the anode 340 within the heterostructure layers. Alternately, the p-type and n-type diffusions can overlap in the proton bombardment regions 127 to form a p-n junction in the wide bandgap material. The optical mirrors of the laser cavity are formed by the multilayer reflector 312 and the dielectric or semiconductor multilayer stack 362, which is formed on the surface of the second spacer layer 320.

The electrical contacts are made to the integrated structure 300 through the first metal contact layer 324, which is connected to the laser anode 340, the second metal contact layer 322, which is connected to the transistor emitter 330, and the third metal contact layer 328, which is connected to the base 323 through the spacer layer 320. Proton bombardment in region 129 isolates the transistor base from the transistor emitter within the heterostructure layers. Proton bombarded regions 126 isolate the integrated transistor/laser 300 from the rest of the chip.

After the layers 312–320 are formed, steps are taken to ensure that the disordered region 332 penetrates into the multilayer reflector 312 during the subsequent annealing. This penetration may be accomplished by forming a shallow groove 134 where cathode/collector 332 will be formed, as shown in FIG. 3B, or by removing a portion of the second spacer layer 320 only where cathode/collector 332 and anode 340 will be formed. The integrated transistor/laser 300 is then made by simultaneously forming the n-type and p-type disordered regions 330, 332 and 340 by annealing the multiple layers 312–320 and the substrate 110 with an arsenic-rich silicon layer deposited over the second spacer layer 320 in the area where the n-type emitter 330 and the n-type cathode/collector 332 will be formed and a gallium-rich silicon layer deposited over the layer 320 in the area where the p-type anode 340 will be formed, as described above.

Alternately, the integrated transistor/laser 300 is made by replacing the arsenic-rich silicon, where n-type emitter 330 and the n-type cathode/collector 332 will be formed, with an undoped silicon layer and annealing the multiple layers and substrate at a high temperature in an arsenic-rich environment as described above. Alternately, if the gallium-rich silicon layer, rather than the arsenic-rich silicon layer, is replaced with undoped silicon, the multiple layers and substrate are annealed at a high temperature in a gallium-rich environment, as described above.

Alternately, an integrated transistor/laser can be formed by combining an P-N-P transistor and a laterally injected surface emitting laser. The geometry of the integrated structure is the same as illustrated in FIGS. 3A and 3B with all the epitaxially layers doped n-type instead of p-type, the disordered regions 330 and 332 made with p-type diffusions and the disordered region 340 made with an n-type diffusion, according to the method of this invention. The region 330 remains the emitter of the transistor and the region 332 remains the collector. However, the region 340 becomes the cathode for the the laser. The contact 328 continues to provide remote access to the base channel 323.

A second embodiment of a heterojunction bipolar transistor integrated with a laterally injected surface emitting diode laser is shown in FIGS. 4A and 4B. The integrated transistor/laser 400 comprises the substrate 210 of n-type GaAs, upon which is grown a multilayer reflector 412. Before growing additional layers, portions of the multilayer 412 are removed in order to expose the underlying substrate. A spacer layer 414 of $n-Ga_{1-x}Al_xAs$ is then epitaxially grown on the exposed portion of substrate 210 and the remaining portion of the multilayer 412. An active n-type multilayer 416 is formed over the spacer layer 414. A second spacer layer 420 of undoped $Ga_{1-x}Al_xAs$ is formed over the multilayer 416. The n-type multilayer 416 comprises a relatively thin conventional double heterostructure active layer of n-GaAs or $n-Ga_{1-y}Al_yAs$, or a single quantum well of n-GaAs or $n-Ga_{1-y}Al_yAs$, or a single quantum well of either n-GaAs or $n-Ga_{1-y}Al_yAs$ sandwiched between carrier confinement layers of $n-Ga_{1-z}Al_zAs$ where $x > z > y$, or a multiple quantum well structure of alternating well layers of n-GaAs or $n-Ga_{1-y}Al_yAs$ and corresponding barrier layers of either AlAs or $n-Ga_{1-y'}Al_{y'}As$ sandwiched between carrier confinement layers of $Ga_{1-z}Al_zAs$, where $x > z \geq y' > y$. All of these layers may be deposited with the well known techniques of metalorganic vapor deposition or molecular beam epitaxy.

Within the epitaxially deposited layers, an P-N-P transistor and separated surface emitting laser are formed to make the monolithic laser/transistor 400. The transistor of this structure comprises a p-type disordered region 430 serving as the transistor emitter, a p-type disordered region 432 serving as the transistor collector, and a base channel 423 formed in the n-type multilayer 416 between the disordered regions 430 and 432. The surface emitting laser of this structure is formed between the n-type disordered region 440 and the p-type disordered region 432. Thus, the n-type region 440 is the laser cathode and the p-type region 432 is simultaneously the anode of the laser and the collector of the transistor. An important feature of the anode/collector 432 is that it extends substantially through all the epitaxially deposited layers and into the multilayer reflector 412 to form the cylindrical optical waveguide for the surface emitting laser.

Proton bombardment in regions 127 provides electrical isolation between the anode/collector 432 and the cathode 440 of the laser within the heterostructure layers. Alternately, the p-type and the n-type diffusions can overlap in regions 127 to form a p-n junction in wide bandgap material. The optical mirrors of the laser cavity are formed by the multilayer reflector 412 and the dielectric or semiconductor multilayer stack 462, which is formed on the surface of the spacer layer 420.

The electrical contacts are made to the integrated structure 400 through the first metal contact layer 124, which is connected to the laser cathode 440, the second metal contact layer 122, which is connected to the transistor emitter 430, and the third metal contact layer 128, which is connected to the base 423 through the substrate 210. The proton bombarded regions 126 isolate the integrated transistor/laser 400 from the rest of the chip.

The integrated transistor/laser 400 is made by simultaneously forming the n-type and p-type disordered regions by annealing the multiple layers 412-420 and the substrate with an arsenic-rich silicon layer deposited over the second spacer layer 420 in the area where the n-type cathode 440 will be formed and a gallium-rich silicon layer deposited over the second spacer layer 420 in the area where the p-type emitter 430 and the p-type anode/collector 432 will be formed, as described above. Alternately, the integrated transistor/laser 400 is made by replacing the arsenic-rich silicon, at a point above where cathode 440 is to be formed, with an undoped silicon layer, then annealing the multiple layers and substrate at a high temperature in an arsenic-rich environment as described above. Alternately, if the gallium-rich silicon layer, rather than the arsenic-rich silicon layer, is replaced with undoped silicon, the multiple layers and substrate are annealed at a high temperature in a gallium-rich environment, as described above.

Alternately, an integrated transistor/laser can be formed by combining an N-P-N transistor and a laterally injected surface emitting laser. The geometry of the integrated structure is the same as illustrated in FIGS. 4A and 4B, except that the substrate and all the epitaxially layers are doped p-type, instead of n-type, the disordered regions 430 and 432 made with n-type diffusions and disordered region 440 are made with an p-type diffusion, according to the method of this invention. The region 430 remains the emitter of the transistor and tile region 432 remains the collector. However, the region 440 becomes the anode for the laser. The contact 128 continues to provide access to the base channel 423 through the p-type substrate 210.

A third class of devices enabled by simultaneous formation of the n-type and p-type IILD regions according to this invention contain buried layers which are to be individually contacted with a wide bandgap emitter or collector. The individual layers may require p-type, n-type, or p-type and n-type contacting. Structures of this type can be used, for example, to make carrier channeling structures, "n-i-p-i" or hetero "n-i-p-i" devices, or p-n junction surface emitting lasers.

Figure 5A:
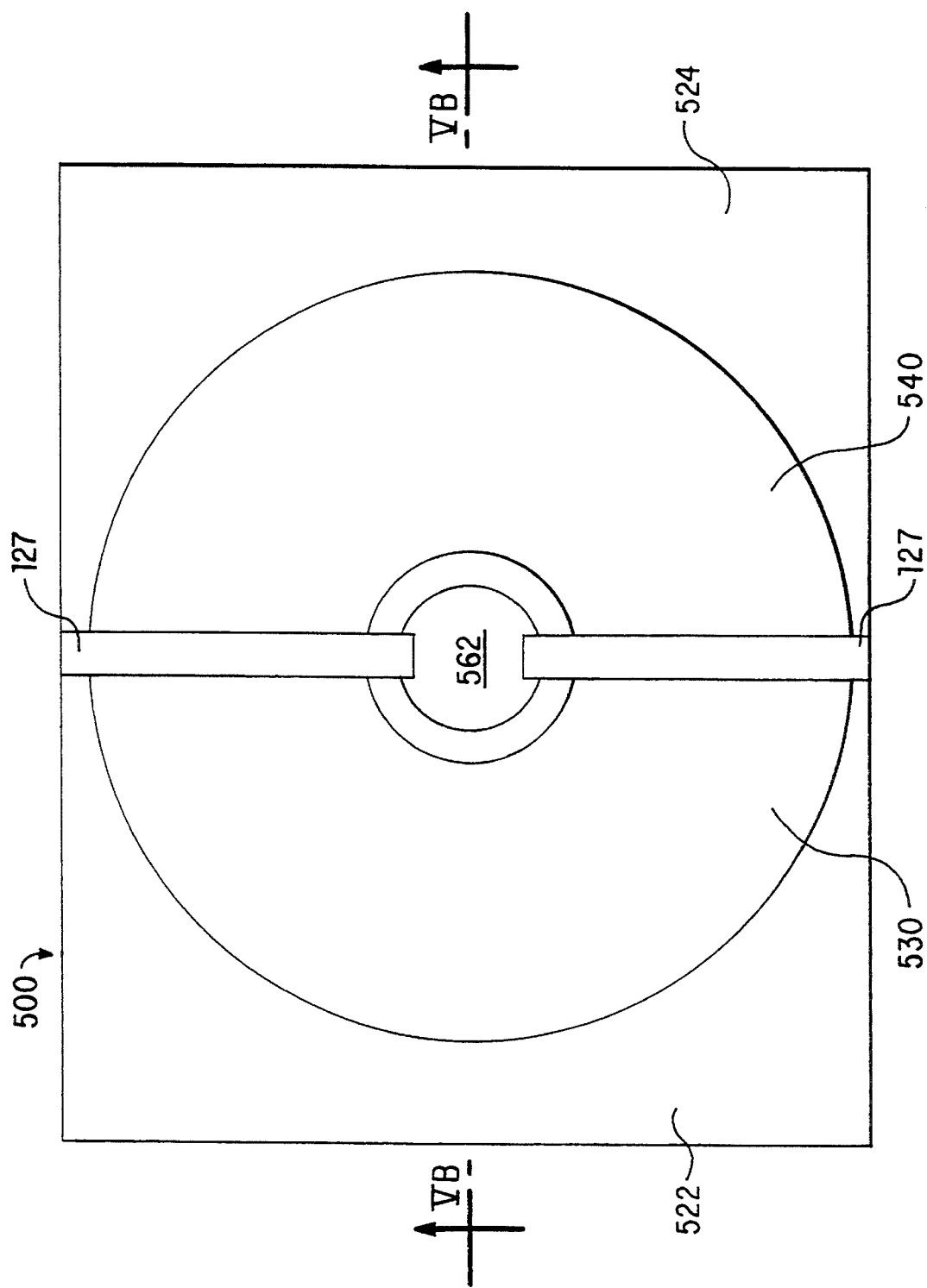
FIG. 5A is a top plan view of a laterally injected surface emitting laser having its anode and cathode on the emitting surface.
Figure 5B:
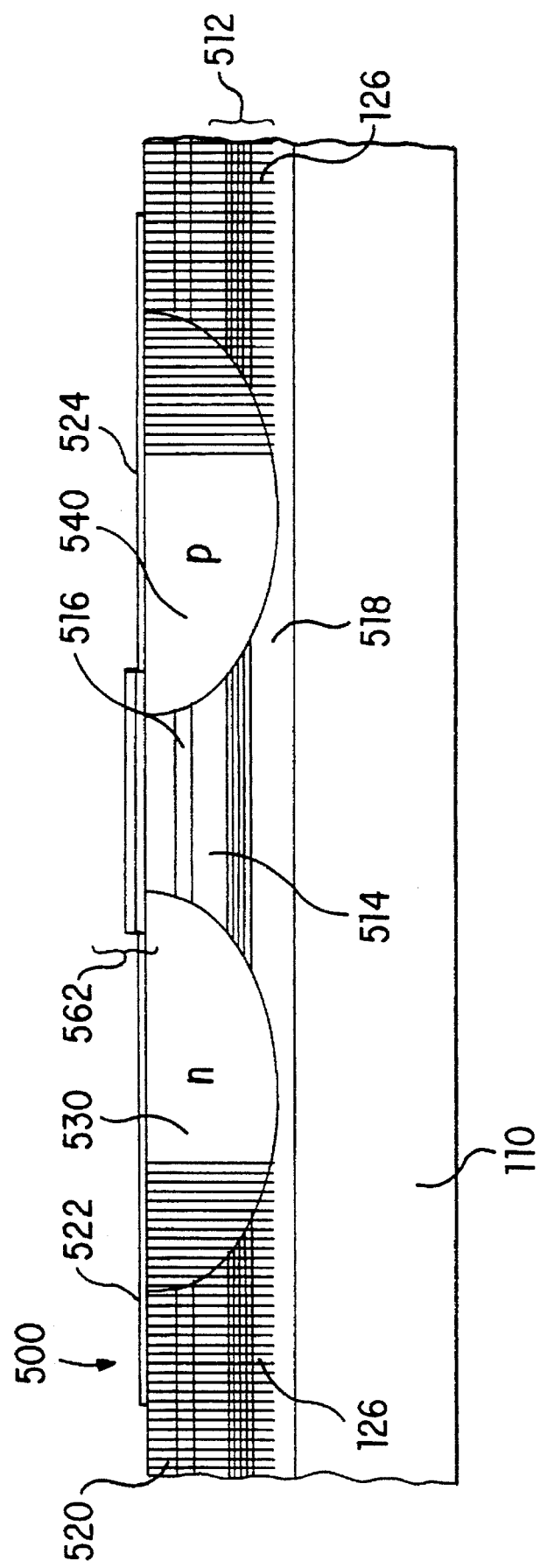
FIG. 5B is a cross-sectional view of the laterally injected surface emitting laser of FIG. 5A.

FIGS. 5A and 5B show a surface emitting laser 500 made according to the principles of this invention. The surface emitting laser 500 comprises the semi-insulating substrate 110 of GaAs, upon which is epitaxially deposited a wide bandgap buffer layer 518 of undoped $Ga_{1-x}Al_xAs$, a multilayer reflector 512, a spacer layer 514 of undoped $Ga_{1-y}Al_yAs$, where $x \geq y$, an undoped active multilayer 516, a second spacer layer 520 of undoped $Ga_{1-y}Al_yAs$, and a dielectric or semiconductor multilayer stack 562 deposited on the surface of the second spacer layer 520. The multilayer 516 comprises either a thin undoped layer of either GaAs or $Ga_{1-w}Al_wAs$, an undoped quantum well layer of either GaAs or $Ga_{1-w}Al_wAs$, or a multiple quantum well structure of undoped quantum well layers of either GaAs or $Ga_{1-w}Al_wAs$ alternating with corresponding undoped barrier layers of either AlAs or $Ga_{1-v}Al_vAs$, where $v \geq y > w$. The multilayer reflector 512 comprises an alternating stack of undoped $Ga_{1-z}Al_zAs$ and $Ga_{1-z'}Al_{z'}As$, where $z \neq z'$, which is designed to provide high optical reflectivity at the lasing wavelength, as known to those skilled in the art. Similarly, multilayer 562 comprises an alternating stack of semiconductor or dielectric layers, which is designed to provide high optical reflectivity at the lasing wavelength.

The surface emitting laser 500 is defined within the epitaxially deposited layers by semi-annular cathode 530 and semi-annular anode 540. The cathode 530 comprises an n-type wide bandgap material formed by impurity induced layer disordering of the as-grown multiple layers, and serves as the electron source for the undoped active layer 516. The anode 540 comprises a p-type wide bandgap material formed by impurity induced layer disordering of the as-grown multiple layers, and serves as the hole source for the undoped active layer 516. The cathode 530 and the anode 540 beneficially extend through the reflector 512 and into the wide bandgap layer 518 to form the cylindrical optical waveguide for the surface emitting laser 500. Proton bombardment in regions 127 provides electrical isolation between the cathode 530 and the anode 540 within the heterostructure layers. Alternately the p-type and n-type diffusions can overlap in regions 127 to form a p-n junction in the wide bandgap material. The optical mirrors of the laser cavity are formed by the multilayer reflector 512 and the dielectric or semiconductor multilayer stack 562.

The electrical connections are made to laser 500 through the cathode metal contact layer 522, which is connected to the cathode 530 and the anode metal contact layer 524, which is connected to the anode 540. Proton bombardment in regions 126 isolates the laser 500 from the rest of the chip. Finally, the multiple layer dielectric reflector 562 is formed in the center of the annular metal layers forming the cathode contact 522 and the anode contact 524.

In the surface emitting laser 500, holes are injected from the anode 540, while electrons are injected from the cathode 530. In the surface emitting laser 500, both electrons and holes are injected into the active layer without passing through either the distributed Bragg reflector 512 or the dielectric stack 562 used to form the laser cavity. Thus, the surface emitting laser 500 inherently has a low series resistance compared to conventional surface emitting lasers, in which carriers must pass through many high bandgap layers.

The surface emitting laser 500 is made by simultaneously forming the n-type and p-type disordered regions by annealing the multiple layers 512–520 and substrate 110 with an arsenic-rich silicon layer deposited over the second spacer layer 520 in the area where the cathode 530 will be formed and a gallium-rich silicon layer deposited over the second spacer layer 520 in the area where anode 540 will be formed, as described above. Alternately, the surface emitting laser 500 is made by replacing the arsenic-rich silicon, above the region where cathode 530 will be formed, with an undoped silicon layer and annealing the multiple layers and substrate at a high temperature in an arsenic-rich environment as described above. Alternately, if the gallium-rich silicon layer rather than the arsenic-rich silicon layer is replaced with undoped silicon, the multiple layers and substrate are annealed at a high temperature in a gallium-rich environment as described above.

Figure 6A:
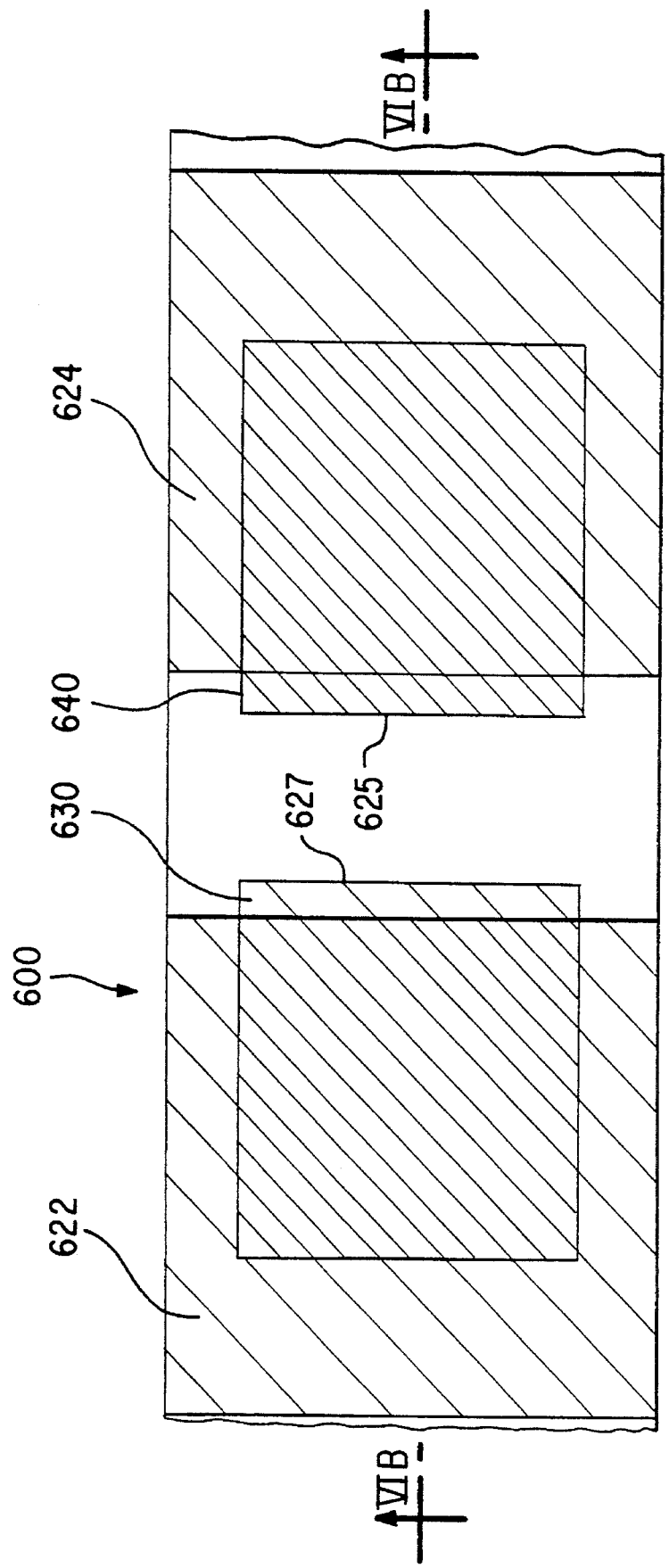
FIG. 6A is a top plan view of a laterally contacted carrier channeling or nipi device formed according to the principles of this invention.
Figure 6B:
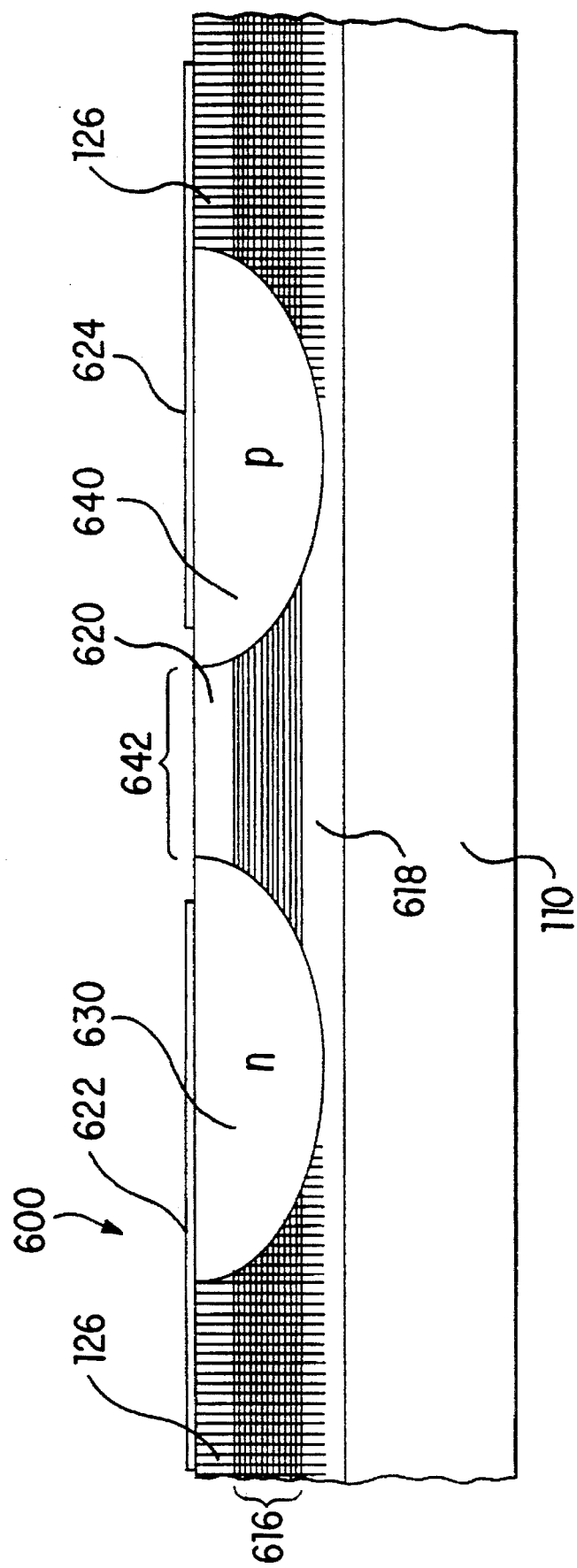
FIG. 6B is a cross-sectional view of the laterally contacted carrier channeling or nipi device of FIG. 6A.

FIGS. 6A and 6B show a carrier channeling device 600 made according to the principles of this invention. The channeling structure 600 comprises the semi-insulating substrate 110 of GaAs, upon which is epitaxially deposited an undoped wide bandgap buffer layer 618 of undoped $Ga_{1-x}Al_xAs$, an active multilayer 616, and a wide bandgap cladding layer 620 of undoped $Ga_{1-x}Al_xAs$. The multilayer 616 comprises thin layers 616a, c, e, etc of p-doped GaAs or $Ga_{1-y}Al_yAs$ alternating with thin layers 616b, d, f, etc of n-doped GaAs or $Ga_{1-z}Al_zAs$, where $x \geq y \geq z$.

The channeling device 600 is defined within the epitaxially deposited layers by the cathode 630 and the anode 640. The cathode 630 comprises an n-type disordered region serving as the wide bandgap contact for the n-doped layers 616a, c, e, etc. The interface 627, as viewed from the top between the cathode 630 and each n-doped layer, can be shaped as desired, e.g. it can be circular, elliptical, linear, etc. The anode 640 comprises a p-type disordered region serving as the wide bandgap contact for the p-doped layers 16b, d, f, etc. The interface 625, as viewed from the top between the anode 640 and each p-doped layer, can be shaped as desired, e.g. it can be circular, elliptical, linear, etc. The electrical connections are made to the carrier channeling device 600 through the cathode metal layer contact 622, which is connected to the cathode 630 and the anode metal layer contact 624, which is connected to the anode 640. A surface region 642 is left open between the contacts for optical access. Proton bombardment in regions 126 isolates the device 600 from the rest of the chip.

The carrier channeling device 600 is made by simultaneously forming the n-type and p-type disordered regions as described above. The channeling device 600 can be used, for example, as a channeling photodiode as disclosed by F. Capasso, et al. in Appl. Phys. Letters vol 41(10), pp 944–946 Nov. 15, 1982, by exposing the surface 642 with the light to be detected. However, Capasso teaches that the p- and n-doped contact regions are defined either by ion implantation or etching and epitaxial regrowth techniques. Ion implantation can dope the layers appropriately but does not increase their bandgap. Etching and regrowth can produce an appropriately doped wide bandgap contact but is a low yield, expensive, and unreliable process. The simultaneous formation of n-type and p-type wide bandgap contacts according to the principles of this invention is a-significant improvement in design which allows low-cost, high yield, reliable fabrication.

Figure 7:
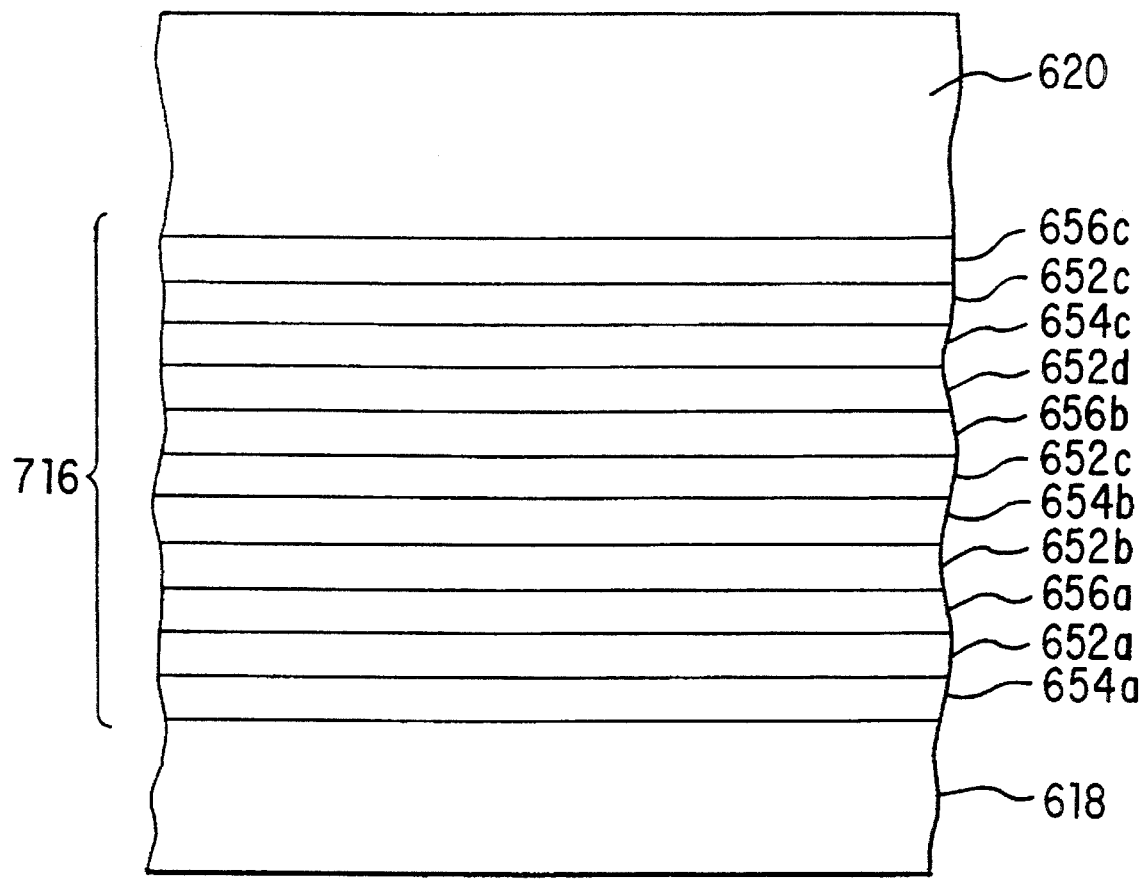
FIG. 7 is a schematic diagram of the layer structure utilized in a "nipi" device.

FIG. 7 shows an expanded view of the active layer 716 for a "nipi" device made according to the principles of this invention. The multilayer active layer 716 comprises thin layers 652a, b, c, etc. of undoped GaAs or $Ga_{1-u}Al_uAs$, sandwiched between alternating thin layers 654a, b, c, etc of n-doped GaAs or $Ga_{1-v}Al_vAs$ and thin layers 656a, b, c, etc of p-doped GaAs or $Ga_{1-w}Al_wAs$, where $v \geq u$ and $w \geq u$. The geometrical structure for the "nipi" device is the same as for the carrier channeling device shown in FIGS. 6A and 6B, with the active multilayer 716 shown in FIG. 7 replacing the standard active multilayer 616 of the carrier channeling device 600.

Such a "nipi" device can be used to make a wide range of devices with adjustable conductivity, adjustable absorption, or tunable luminescence, as disclosed by G. H. Döhler, and K. Ploog, in Synthetic Modulated Structures, edited by L. L. Chang and B. C. Glessin, Academic Press, 1985, New York, pp 163–214. However Döhler teaches that the p- and n-doped contact regions are defined by alloying p-type and n-type elements such as Sn and Zn into the multiple layers. Such alloying can appropriately dope the layers but can not increase the bandgap of the doped layers. Etching followed by regrowth could produce appropriately doped wide bandgap contacts but is a low yield, expensive, and unreliable process. The simultaneous formation of n-type and p-type wide bandgap contacts according to the principles of this invention is a significant improvement in design which enables low-cost, high yield, reliable fabrication of "nipi" devices. The wide bandgap contacts are especially advantageous because they suppress carrier leakage between a contact and a layer of opposite polarity while enhancing carrier injection between a contact and a layer of the same polarity.

Figure 8A:
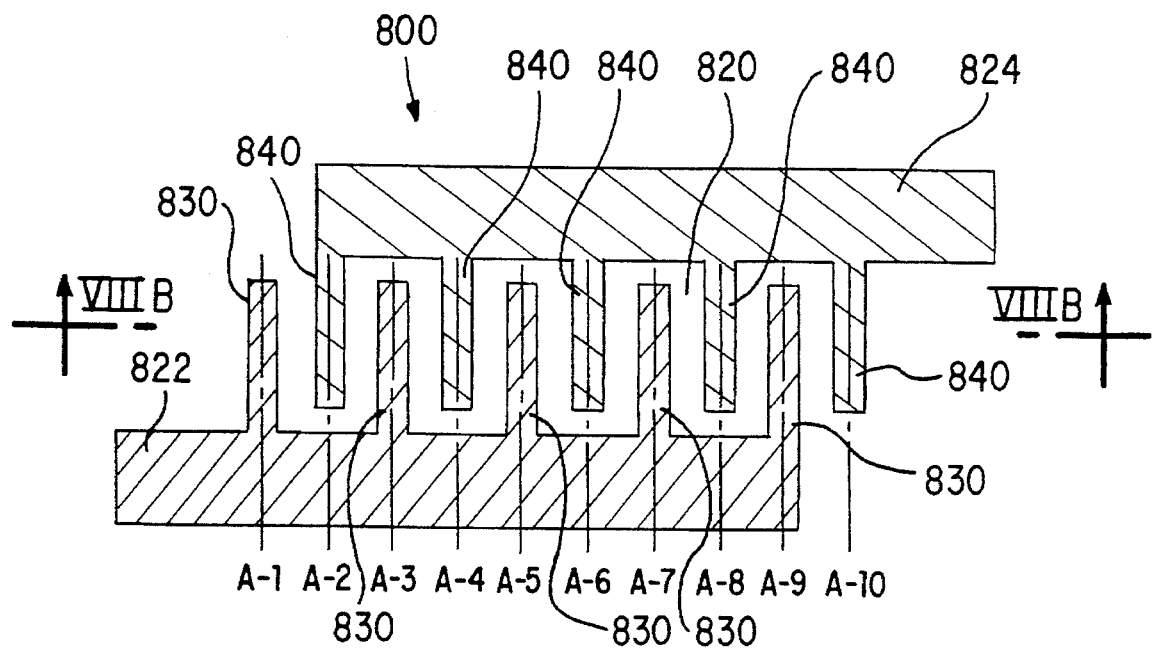
FIG. 8A is a top plan view of an interdigitated semiconductor device formed according to the principles of this invention.
Figure 8B:
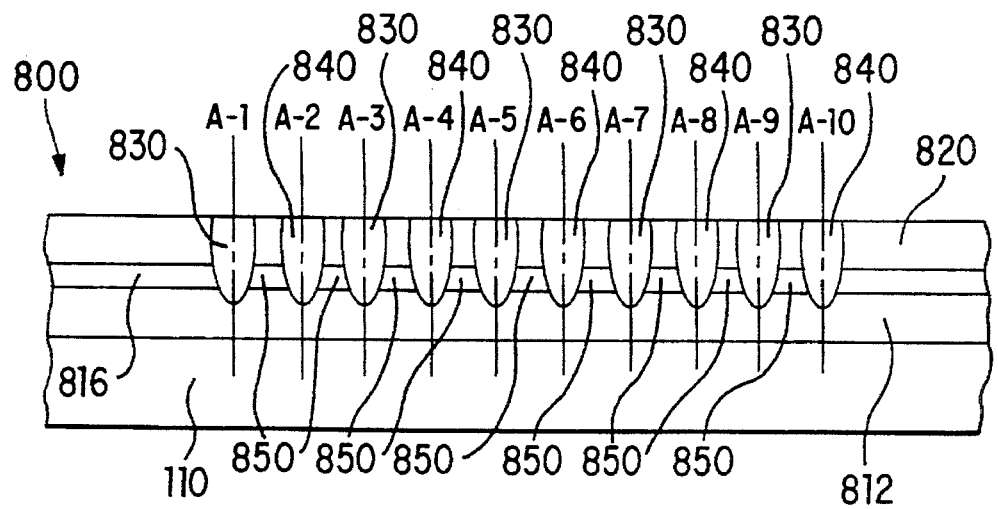
FIG. 8B is a cross-sectional view of the semiconductor device of FIG. 8A.

A fourth class of devices enabled by simultaneous formation of n-type and p-type IILD regions according to the principles of this invention consist of novel interdigitated structures, as shown in FIGS. 8A and 8B. Structures of this type can be used, for example, to make fast optical detectors or edge-emitting distributed feedback lasers. One embodiment of an interdigitated structure made according to this invention is shown in FIG. 8A and 8B. As shown in FIG. 8B, the interdigitated structure 800 comprises the semi-insulating substrate 110 of GaAs, upon which is epitaxially deposited a wide bandgap layer 812 of undoped $Ga_{1-x}Al_xAs$, an undoped active multilayer 816, and a second wide bandgap layer 820 of undoped $Ga_{1-y}Al_yAs$. The layers contained in the active multilayer 816 will depend on the intended function of the interdigitated structure. For example, if the interdigitated structure is a pin photodiode, multilayer 816 can comprise a single undoped layer of GaAs or a multiple quantum well structure of undoped quantum well layers of GaAs alternating with corresponding undoped barrier layers of either AlAs or $Ga_{1-y}Al_yAs$. The incident optical wave is absorbed in the GaAs layers of either multilayer. Alternately, if the interdigitated structure is a distributed feedback laser, the multilayer 816 can comprise an active layer configuration suitable for laser operation, e.g. an undoped quantum well layer of either GaAs or $Ga_{1-w}Al_wAs$, or a multiple quantum well structure of undoped quantum well layers of either GaAs or $Ga_{1-w}Al_wAs$ alternating with corresponding undoped barrier layers of either AlAs of $Ga_{1-y}Al_yAs$ where $v \geq y > w$.

The interdigitated structure is defined within the epitaxially deposited layers by the n-type diffused/disordered regions 830, which alternate with the p-type diffused/disordered regions 840. Since the disordered regions of opposite polarity do not touch or overlap, regions of low bandgap 850 are formed in active layer 816 between the disordered regions 830 and 840. A single electrical contact 822 is made to all of the n-type diffused/disordered regions 830 and a single electrical contact 824 is made to all of the p-type diffused/disordered regions 840. The contacts 822 and 824 can extend partly or entirely over each of the n-type and p-type regions 830 and 840, respectively. Likewise, the laterally extending regions 830 and 840 may overlap only in part or over substantially their entire length, as shown in FIG. 8A.

The interdigitated structure 800 is made by simultaneously forming the n-type and p-type disordered regions 830 and 840, as described above.

The interdigitated structure 800 with an appropriate active layer 816 operates as a p-i-n optical detector by applying a positive voltage on the contact 822 relative to the contact 824. This bias condition effectively reverse biases the undoped regions 850, thereby establishing an electric field within the regions 850 which sweeps electrons to the n-doped regions 830 and holes to the p-doped regions 840. The light to be detected is introduced into the detector 800 either in a direction normal to the active multilayer 816 between the interdigitated fingers of the contacts 822 and 824 or in the waveguide formed between the wide bandgap layers 812 and 820. The absorption of photons in the undoped regions 850 produces electron/hole pairs, which are swept out of the regions 850 and into the regions 830 and 840 by the electric field established by the bias voltage on the contacts 822 and 824.

Alternately, a similar structure can be used as a gain-coupled distributed feedback laser by applying a positive voltage on the contact 824 relative to the contact 822. This voltage polarity forward biases the anode regions 840 and the cathode regions 830, thereby injecting carriers into the low bandgap regions 850. The injected carriers in the regions 850 then provide the optical gain required for lasing operation. Distributed optical feedback is obtained by choosing the center-to-center spacing of the regions 850 and the center-to-center spacing between any region 830 and its adjacent regions 840 to be equal to an integer number of half wavelengths of the desired lasing wavelength in the semiconductor medium. At these spacings, reflections of the optical waves from the gain in the regions 850 and the changes in the refractive index at the interfaces between the regions 830 and 840 establish the well-known Bragg condition, thus producing distributed optical feedback in the active layer 816. For example, the center-to-center spacing of the regions would be about 0.11 μm, or 0.22 μm, or 0.33 μm, etc. for an emission wavelength of 780 nm.

Figure 9A:
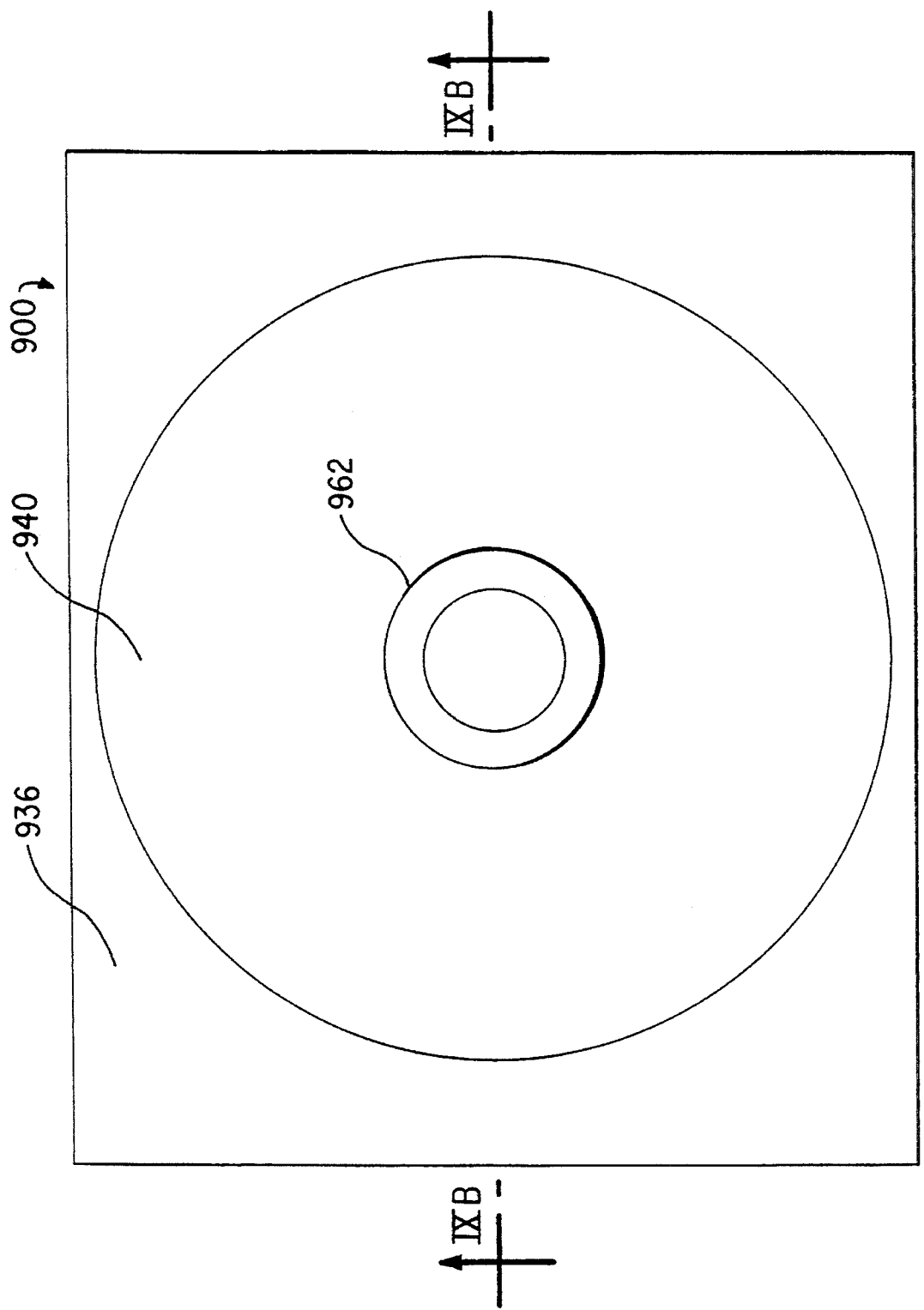
FIG. 9A is a top plan view of a laterally injected active distributed feedback surface emitting laser having only one contact on the emitting surface.
Figure 9B:
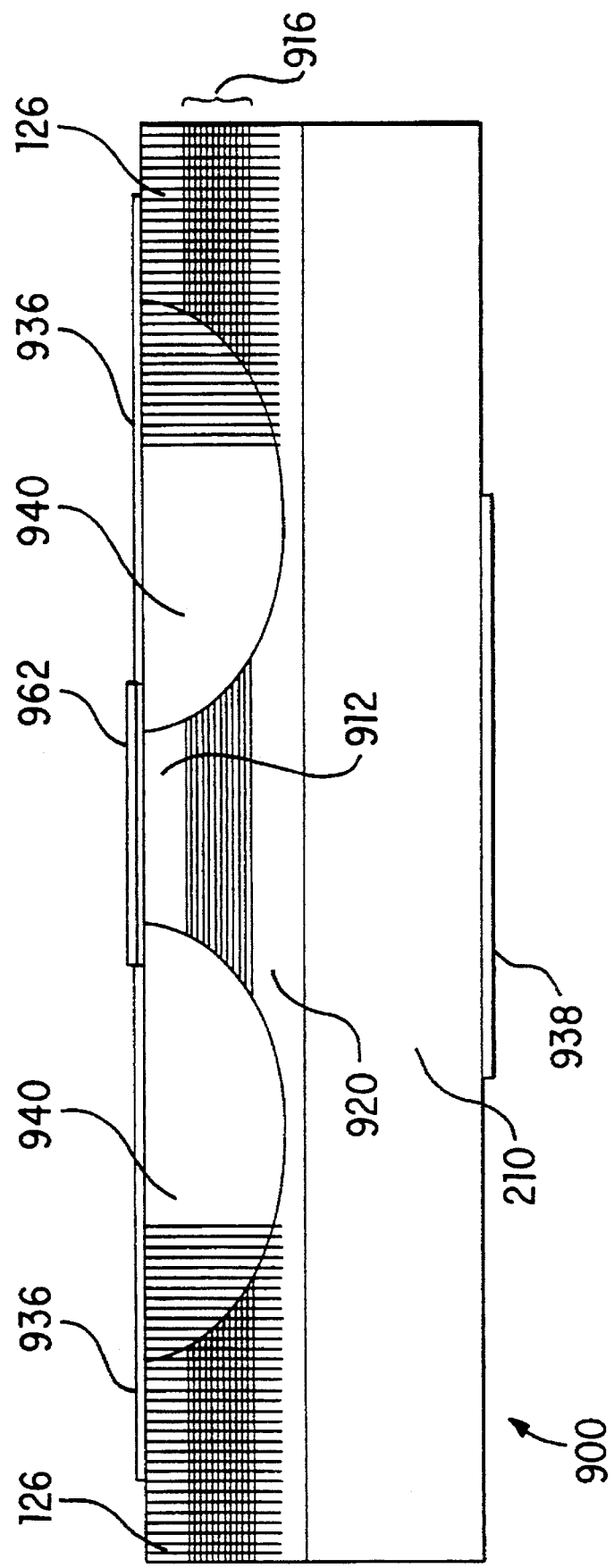
FIG. 9B is a cross-sectional view of the laterally injected active distributed feedback surface emitting laser of FIG. 9A.

FIGS. 9A and 9B show a first embodiment of a laterally injected active distributed feedback surface emitting laser 900 made according to the principles of this invention. The laser 900 comprises the conductive substrate 210 of n-doped GaAs, a wide bandgap buffer layer 920 of n-$Ga_{1-x}Al_xAs$, an active undoped multilayer 916, and a wide bandgap window layer 912 of undoped $Ga_{1-y}Al_yAs$, where y≧x. The undoped multilayer 916 comprises a periodic sequence of active quantum well layers of undoped GaAs or undoped $Ga_{1-z}Al_zAs$, alternating with barrier layers of undoped $Ga_{1-z'}Al_{z'}As$, wherein z'>z. Typically, the total number of periods in the alternating layer sequence is greater than 25 (i.e. greater than 50 layers).

The period of the alternating layers is chosen to be approximately ½ of the desired lasing wavelength in the semiconductor material. For example, for an emission wavelength of 780 nm, the center to center spacing of the quantum wells is about 1100 nm. The periodicity of the layer structure is a critical parameter for effective operation of the surface emitting laser at a desired wavelength. The thickness and composition of each quantum well is chosen to maximize the gain at the emission wavelength. For 780 nm, each quantum well may comprise $Ga_{0.88}Al_{0.12}As$ of 150 nm thickness.

Preferably, each of the quantum well layers of the multilayer 916 (as well as the multilayer 1016) is formed from one of the following materials: gallium arsenide, gallium aluminum arsenide, gallium indium phosphide and aluminum gallium indium phosphate. In the multilayer 916 (and the multilayer 1016) these materials are undoped. Likewise, each of the barrier layers of the multilayer 916 (as well as the multilayer 1016) as formed from one of the following materials: gallium aluminum arsenide; aluminum arsenide, aluminum indium phosphide and aluminum gallium indium phosphide. In the multilayer 916 (as well as the multilayer 1016), these materials are undoped.

The composition of each barrier layer is chosen to be transparent at the lasing wavelength and to provide adequate carrier confinement of carriers in the quantum wells. For 780 nm, each barrier layer may comprise $Ga_{1-z'}Al_{z'}As$ with z'<0.4 and have a thickness of 950 nm. The value of z' is restricted to low values by the heat generated in passing current through the undoped barrier layers. The interface between the quantum well and the barrier layer may be graded to reduce the voltage. Other combinations of composition and thickness for the quantum well in conjunction with other combinations of composition and thickness for the barrier layer may be used to optimize the structure for operation at a wavelength of 780 nm. As is known in the art, the epitaxial growth of these layers may be carried out by molecular beam epitaxy (MBE) or metalorganic chemical vapor deposition (MOCVD).

The surface emitting laser 900 is defined within the epitaxially deposited layers by the p-type disordered region 940. The p-type diserdered region 940 is formed in an annulus, which beneficially extends through the active multilayer 916 and into the wide bandgap layer 920, to form a cylindrical optical waveguide for the surface emitting laser 900. The p-type disordered region 940 serves as the hole source for the active quantum wells in the multilayer 916. The annulus may be circular, as shown in FIG. 9A, or elliptical or square or any other desired shape.

The electrical contacts are made to the surface emitting laser 900 through the anode metal contact layer 936, which is connected to the p-type disordered region 940, and the cathode metal contact layer 938, which is connected to the substrate 210. The cathode metal contact layer 936 has an opening 937 centered on the undisordered portion of the multilayer 916 to allow light emission from the laser 900. A proton bombardment in the region 126 isolates the laser 900 from the other parts of the chip. Finally, an anti-reflective coating 962 is formed in the center of the annular portion of the anode metal contact layer 936.

The surface emitting laser 900 is made by forming the p-type disordered region 940 within the multiple semiconductor layers 912–920. The disordered region 940 is formed by annealing the multiple layers 912–920 and the substrate 210 with a gallium-rich silicon layer deposited over the layer 912 in the area where the p-type disordered region 940 will be formed, as described in U.S. patent application Ser. No. 08/174,911. Alternately, the surface emitting laser 900 is made by replacing the gallium-rich silicon above where the disordered region 40 will be formed with an undoped silicon layer and annealing the multiple layers and the substrate at a high temperature in a gallium-rich environment, as is also described in U.S. patent application Ser. No. 08/174911.

In the surface emitting laser 900, holes are injected into the quantum wells of the multilayer 916 from the p-type disordered region 940, while electrons are injected into the quantum wells from the substrate 210 through the buffer layer 920 and the barrier layers in multilayer 916. Thus, the current flows from a current source (not shown in FIGS. 9A and 9B), into the anode metal contact layer 936, through the disordered region 940, through the quantum well layers in the multilayer 916, through the barrier layers in the multilayer 916, through the buffer layer 920, through the substrate 210 into the cathode metal contact layer 938 and back to the current source. The recombination of electrons and holes in the quantum wells of the multilayer 916 provides the optical gain required to produce lasing. Coupling of the forward and backward travelling optical waves by the periodic gain and periodic refractive index produced by the multiple alternating layers in the multilayer 916 produces the distributed optical feedback required to sustain lasing oscillation. Light is emitted from the laser 900 through anti-reflective coating 962. The coating 962 substantially eliminates optical reflections from the index change at the air/semiconductor interface, which may disturb the distributed optical feedback.

Alternately, the surface emitting laser 900 can be formed by using an n-type impurity induced layer disordering instead of the p-type disordering process described above. The geometry of the surface emitting laser remains the same as illustrated in FIGS. 9A and 9B, with the substrate 210 and the buffer layer 920 doped p-type instead of n-type. The metal contact layer 936 is then the laser cathode and the metal contact layer 938 is the laser anode. N-type layer disordering is well known to those skilled in the art and is taught in U.S. Pat. No. 4,824,798.

Figure 10B:
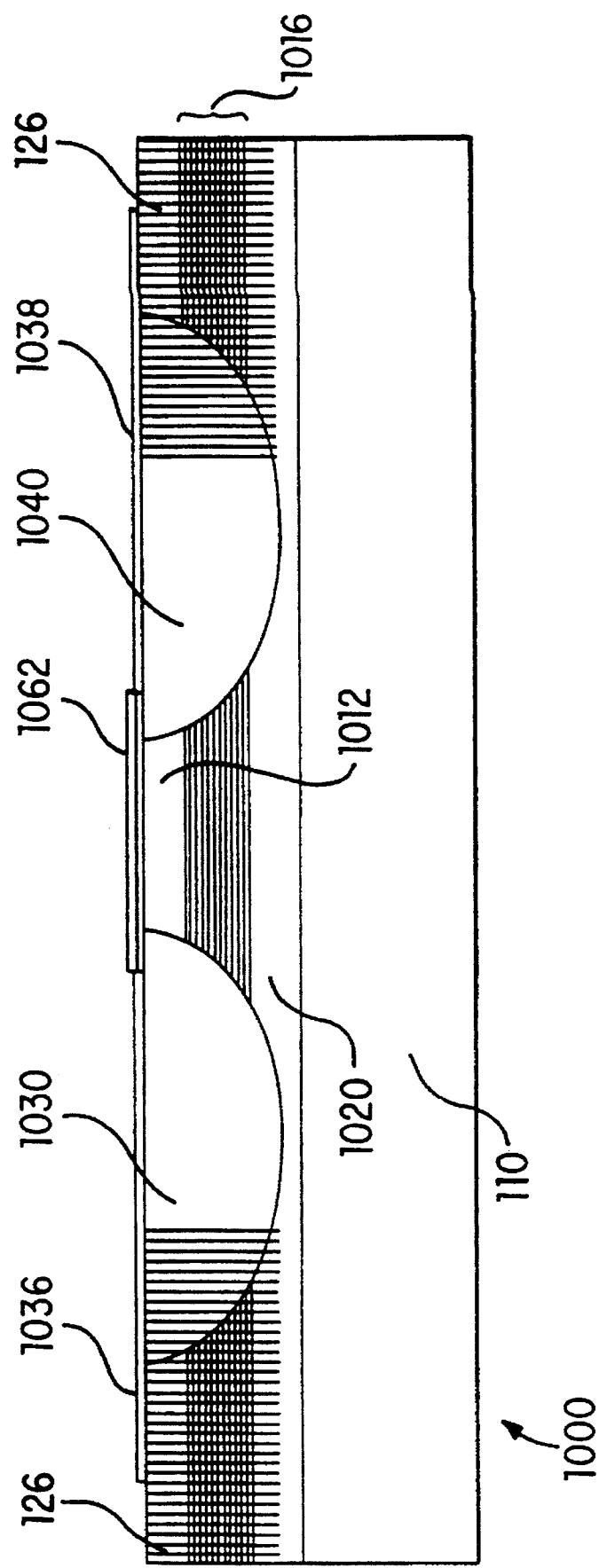
FIG. 10B is a cross-sectional view of the laterally injected surface emitting laser of FIG. 10A.

FIGS. 10A and 10B show a second embodiment of a laterally injected active distributed feedback surface emitting laser 1000 made according to the principles of this invention. The laser 1000 comprises the semi-insulating substrate 110 of GaAs, upon which is epitaxially deposited a wide bandgap buffer layer 1020 of n-$Ga_{1-x}Al_xAs$, an active undoped multilayer 1016, and a wide bandgap window layer 1012 of undoped $Ga_{1-y}Al_yAs$, where $y \geq x$. The undoped multilayer 1016 comprises a periodic sequence of active quantum wells of undoped GaAs or undoped $Ga_{1-z}Al_zAs$ alternating with barrier layers of undoped $Ga_{1-z'}Al_{z'}As$, similar to that described in relation to FIGS. 9A and 9B. However, in the present embodiment, the Al content of the barrier layers can be much greater than in the embodiment of FIGS. 9A and 9B. For example, z' can be greater than 0.8, thereby providing maximum carrier confinement in the quantum wells of multilayer 1016.

The period of the alternating layers is again chosen to be approximately ½ of the desired lasing wavelength in the semiconductor material in order to provide distributed optical feedback and the thickness and composition of each quantum well is chosen to maximize the gain at the emission wavelength. As is known in the art, the epitaxial growth of these layers may be carried out by molecular beam epitaxy (MBE) or metalorganic chemical vapor deposition (MOCVD).

The surface emitting laser 1000 is defined within the epitaxially deposited layers by the semi-annular region 1030 and the semi-annular region 1040. The region 1030 comprises an n-type wide bandgap material formed by impurity induced layer disordering of the as-grown multiple layers. The n-type disordered region 1030 serves as the electron source for the undoped quantum wells in the multilayer 1016. The region 1040 comprises a p-type wide bandgap material formed by impurity induced layer disordering of the as-grown multiple layers. The p-type disordered region 1040 serves as the hole source for the undoped quantum wells in the multilayer 1016. The disordered regions 1030 and 1040 beneficially extend through the active multilayer 1016 and into the wide bandgap layer 1020 to form the cylindrical optical waveguide for the surface emitting laser 1000. A proton bombardment in regions 127 provides electrical isolation within the heterostructure layers between the disordered region 1030 and the disordered region 1040. Alternately, the p-type and n-type diffusions can overlap in the regions 1027 to form a p-n junction in the wide bandgap material.

The electrical connections are made to the laser 1000 through the cathode metal contact layer 1036, which is connected to the disordered region 1030 and the anode metal contact layer 1038, which is connected to the disordered region 1040. The semiannular metal contact layers for the cathode and anode contacts 1036 and 1038 form an opening around the undisordered portion of the multilayer 1016 for light emission. A proton bombardment in the regions 126 isolates the laser 1000 from other parts of the chip. Finally, the multiple layer dielectric reflector 1062 is formed in the center of the semiannular metal contact layers forming the cathode contact 1036 and the anode contact 1038.

The surface emitting laser 1000 is made by simultaneously forming the n-type and p-type disordered regions within the multiple semiconductor layers 1012–1020. The disordered regions 1030 and 1040 are formed by annealing the multiple layers 1012–1020 and the substrate 110 with an arsenic-rich silicon layer deposited over the layer 1012 in the area where the n-type disordered region 1030 will be formed and a gallium-rich silicon layer deposited over layer 1012 in the area where the p-type disordered region 1040 will be formed, as described in U.S. patent application Ser. No. 08/174911. Alternately, the surface emitting laser 1000 is made by replacing the arsenic-rich silicon above where the disordered region 1030 will be formed with an undoped silicon layer and annealing the multiple layers and substrate at a high temperature in an arsenic-rich environment. Alternately, if the gallium-rich silicon layer, rather than the arsenic-rich silicon layer, is replaced with undoped silicon, the multiple layers and substrate are annealed at a high temperature in a gallium-rich environment.

In the surface emitting laser 1000, holes are injected into the quantum wells of the multilayer 1016 from the p-type disordered region 1040, while electrons are injected from the n-type disordered region 1030. Thus, the current flows from a current source (not shown in FIGS. 10A and 10B), into the anode contact 1038, through the disordered region 1040, through the active quantum wells in the multilayer 1016, through the disordered region 1030, into the cathode contact 1036 and back to the current source. In the surface emitting laser 1000, the current flows through the active multilayer 1016 without passing through the barrier layers. Thus, the surface emitting laser 1000 inherently has a lower series resistance than the surface emitting laser of the embodiment of FIGS. 9A and 9B, wherein the carriers must pass through many high bandgap barrier layers. Consequently, there is no need to grade the interface between the quantum wells and the barrier layers, as is often done by those skilled in the art. Thus, the laser 1000 is a preferred form of this embodiment of the invention.

The recombination of electrons and holes in the quantum wells of the multilayer 1016 provides the optical gain required to produce lasing. Coupling the forward and backward travelling optical waves by the periodic gain and periodic refractive index produced by the multiple alternating layers in the multilayer 1016 produces the distributed optical feedback required to sustain the lasing oscillation. Light is emitted from the laser 1000 through the anti-reflective coating 1062. The coating 1062 substantially eliminates optical reflections from the index change at the air/semiconductor interface, which may influence the distributed optical feedback.

FIGS. 11A and 11B illustrate a high density array 1100 of independently addressable surface emitting lasers, made according to the principles of this invention. Each laser element 1142 in this array 1100 is formed identically to the laser 1000 described in FIGS. 10A and 10B. As shown, the contacts 1136 and 1138 for each laser element 1142 are formed separately and isolated from the contacts of the other laser elements 1142. Alternately, all the anodes 1138 or all the cathodes 1136 have a common metal contact layer if they are to be connected to a common ground. In either case, at least the cathode contact 1136 or the anode contact 1138 for each laser element 1142 remains isolated from the other contacts (1136 or 1138) for the other laser elements 1142, so that each laser element 1142 can be modulated independently from the other laser elements 1142.

Alternately, the array 1100 can comprise surface emitting laser elements 1142 made identically to the laser 900 described in FIGS. 9A and 9B. In this case, each laser has its own addressable contact 1136 or 1138 on the top surface. The other contact 1138 or 1136 on the substrate is then common to all the laser elements 1142. Finally, each laser element 1142 may be made with either p-type disordering or n-type disordering.

While this invention has been described in conjunction with a number of different specific apparatus, it is evident that many alternatives, modifications and variations will be apparent to those skilled in the art. Accordingly, it is intended to embrace all such alternatives, modifications and variations as fall within the spirit and broad scope of the appended claims.

What is claimed is:

1. A semiconductor device, comprising:
   a substrate having a surface;
   a plurality of semiconductor layers formed over the substrate;
   a p-type region of wide-bandgap material; and
   an n-type region of wide-bandgap material;
   wherein the p-type and n-type regions are formed by impurity induced layer disordering of at least two of the plurality of semiconductor layers, and both the p-type and n-type regions are doped with a same single impurity species, the p-type and n-type regions being laterally spaced from each other parallel to the surface of the substrate.

2. The semiconductor device of claim 1, wherein the same single impurity species for inducing said impurity induced layer disordering in both the p-type and n-type regions is one of carbon, silicon, germanium, tin and lead.

3. The semiconductor device of claim 1, wherein said impurity induced layer disordering is induced by diffusion into both of the p-type and n-type regions of one of carbon, silicon, germanium, tin and lead.

4. The semiconductor device of claim 1, wherein said p-type and n-type regions are simultaneously formed by being doped with the single impurity species.

5. The semiconductor device of claim 1, comprising a monolithically integrated heterojunction bipolar transistor and diode laser.

6. The semiconductor device of claim 1, wherein said p-type and n-type regions are spatially interdigitated.

7. The semiconductor device of claim 1, comprising a surface emitting diode laser.

8. The semiconductor device of claim 1, comprising an array of diode lasers.

9. The semiconductor device of claim 1, comprising a carrier channeling device.

10. The semiconductor device of claim 1, wherein the device further comprises a plurality of alternating layers, the layers formed from at least two of an n-type material, a p-type material, and an undoped material, and wherein said p-type and n-type regions contact the plurality of alternating layers.

11. A carrier channeling device, comprising:
   a semi-insulating substrate having a surface;
   a first wide bandgap layer formed over the substrate;
   an active multilayer stratum formed over the first wide bandgap layer;
   a second wide bandgap layer formed over the active multilayer stratum;
   a wide bandgap anode region formed by impurity induced layer disordering in the second wide bandgap layer, extending through the active multilayer stratum and into the first wide bandgap layer;
   a wide bandgap cathode region formed by impurity induced layer disordering in the second wide bandgap layer, extending through the active multilayer stratum and into the first wide bandgap layer;
   a first contact layer formed over the anode region; and
   a second contact layer formed over the cathode region, wherein the anode region and the cathode region are laterally spaced from each other parallel to the surface of the substrate.

12. The carrier channeling device of claim 11, wherein one of said anode and cathode regions are formed from material having a bandgap larger than the bandgap of a lowest bandgap material present in said active multilayer stratum.

13. The carrier channeling device of claim 11, wherein said anode and cathode region are formed by impurity induced layer disordering by doping both of said anode and cathode regions with a same single impurity species.

14. The carrier channeling device of claim 11, wherein said anode and cathode regions are formed of oppositely doped materials.

15. The carrier channeling device of claim 11, wherein the anode and cathode regions are formed simultaneously by impurity induced layer disordering.

16. The carrier channeling device of claim 11, wherein the anode and cathode regions are formed with impurity induced layer disordering by first partially forming only one of the anode and cathode regions and then completing formation of said one region simultaneous with formation of the other of the anode and cathode regions.

17. The carrier channeling device of claim 1, wherein:
   the active multilayer stratum comprises a plurality of n-type doped layers arranged alternatively with a plurality of p-type doped layers.

18. The carrier channeling device of claim 17, wherein:
   the cathode region is formed of an n-type material and the anode region is formed of a p-type material;
   the cathode region provides a wide bandgap contact for the plurality of n-type doped layers; and
   the anode region provides a wide bandgap contact for the plurality of p-type doped layers.

19. The carrier channeling device of claim 11, wherein the active multilayer stratum comprises a plurality of undoped layers, each sandwiched between alternating n-type doped layers and p-type doped layers.

20. The carrier channeling device of claim 19, wherein:
   the cathode region is formed of an n-type material and the anode region is formed of a p-type material;

the cathode region provides a wide bandgap contact for the plurality of n-type doped layers; and the anode region provides a wide bandgap contact for the plurality of p-type doped layers.

21. An interdigitated semiconductor device comprising:

a semi insulating substrate having a surface;

a first wide bandgap layer formed over the substrate;

an undoped active multilayer stratum formed over the first wide bandgap layer;

a second wide bandgap layer formed over the active multilayer stratum;

a plurality of wide bandgap n-type doped regions formed in the second wide bandgap layer and extending through the active multilayer stratum into the first wide bandgap layer;

a plurality of wide bandgap p-type doped regions formed in the second wide bandgap layer and extending through the active multilayer stratum into the first wide bandgap layer;

a first contact layer formed over the second wide bandgap layer and at least a first portion of each of the plurality of n-type doped regions; and a second contact layer formed over the second wide bandgap layer and at least a first portion of each of the plurality of p-type doped regions;

wherein the n-type and p-type doped regions are laterally spaced from each other and extend laterally parallel to the surface of the substrate and are alternatively aligned in a linear array, with at least a second portion of each n-type doped region adjacent at least a second portion of at least one p-type doped region, a low band gap region of the active multilayer stratum formed between each pair of laterally adjacent p-type and n-type doped regions.

22. The interdigitated device of claim 21, wherein said n-type and p-type regions are formed by impurity induced layer disordering.

23. The interdigitated device of claim 21, wherein the n-type and p-type regions are formed simultaneously by impurity induced layer disordering.

24. The interdigitated device of claim 23, wherein both the p-type and n-type regions are doped with a same single impurity species.

25. The interdigitated device of claim 21, wherein the n-type and p-type regions are formed with impurity induced layer disordering by first partially forming only one of the p-type and n-type regions and then completing formation of said one region simultaneous with formation of the other of the p-type and n-type regions.

* * * * *

UNITED STATES PATENT AND TRADEMARK OFFICE
CERTIFICATE OF CORRECTION

PATENT NO. : 5,455,429
DATED : October 3, 1995
INVENTOR(S) : Thomas L. Paoli et al.

It is certified that error appears in the above-identified patent and that said Letters Patent is hereby corrected as shown below:

Column 1,
Line 5, insert as a new paragraph:
-- This invention was made with Government support under Agreement No. N00014-82-C-0244 awarded by the Office of Naval Research. The Government has certain rights in this invention. --.

Signed and Sealed this

Thirteenth Day of June, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 5,455,429 |
| APPLICATION NO. | : 08/174912 |
| DATED | : October 3, 1995 |
| INVENTOR(S) | : Thomas L. Paoli et al. |

Page 1 of 1

It is certified that error appears in the above-identified patent and that said Letters Patent is hereby corrected as shown below:

Col. 1, lines 10-11 replace: "Agreement No. N00014-82-C-0244"

with: -- Agreement No. N00014-92-C-0009 --

Signed and Sealed this

Ninth Day of February, 2010

David J. Kappos
*Director of the United States Patent and Trademark Office*